(12) United States Patent
Kawai et al.

(10) Patent No.: US 7,276,436 B2
(45) Date of Patent: Oct. 2, 2007

(54) MANUFACTURING METHOD FOR ELECTRONIC COMPONENT MODULE AND ELECTROMAGNETICALLY READABLE DATA CARRIER

(75) Inventors: Wakahiro Kawai, Shigaken (JP); Noriaki Sato, Shiga-ken (JP)

(73) Assignee: Omron Corporation (JP)

( * ) Notice: Subject to any disclaimer, the term of this patent is extended or adjusted under 35 U.S.C. 154(b) by 322 days.

(21) Appl. No.: 10/724,202

(22) Filed: Dec. 1, 2003

(65) Prior Publication Data

US 2004/0112636 A1    Jun. 17, 2004

(30) Foreign Application Priority Data

Dec. 17, 2002    (JP)    ............ P.2002-364920

(51) Int. Cl.
*H01L 21/44* (2006.01)
(52) U.S. Cl. ............ 438/612; 438/103; 438/108; 438/613; 257/777; 257/E21.021
(58) Field of Classification Search ........ 438/106, 438/108, 613; 257/777, 778, E21.021, E21.121
See application file for complete search history.

(56) References Cited

U.S. PATENT DOCUMENTS

| 6,214,446 | B1 |   | 4/2001 | Funada et al. |
| 6,406,990 | B1 | * | 6/2002 | Kawai ............ 438/612 |
| 6,410,415 | B1 |   | 6/2002 | Estes et al. |
| 6,798,072 | B2 | * | 9/2004 | Kajiwara et al. ...... 257/778 |
| 2001/0009342 | A1 | * | 7/2001 | Furukawa et al. ...... 310/313 A |
| 2002/0031868 | A1 |   | 3/2002 | Capote et al. |
| 2002/0115278 | A1 | * | 8/2002 | Kawai ............ 438/612 |
| 2002/0149298 | A1 | * | 10/2002 | Furukawa et al. ...... 310/340 |

FOREIGN PATENT DOCUMENTS

| EP | 0 521 649 A2 | 1/1993 |
| EP | 0 521 649 A3 | 1/1993 |
| EP | 1 104 017 A2 | 5/2001 |
| EP | 1 205 970 A2 | 5/2002 |
| EP | 1 104 017 A3 | 11/2003 |
| GB | 1 002 046 A | 8/1965 |
| JP | 06 053631 A | 2/1994 |
| JP | 6-243358 | 9/1994 |
| JP | 2586154 | 12/1996 |
| JP | 9-241518 | 9/1997 |
| JP | 11-176022 | 7/1999 |
| JP | 11-333409 | 12/1999 |

OTHER PUBLICATIONS

Kisker-Biotech: "Microparticles", Dec. 25, 2001, XP002418558, 9 pages.

* cited by examiner

*Primary Examiner*—Thao P. Le
(74) *Attorney, Agent, or Firm*—Dickstein Shapiro LLP

(57) ABSTRACT

A semiconductor bear chip having a bump subjected to high temperatures is pressed, from the upper side, onto a wiring board including a wiring pattern, a thermosetting resin film covering an electrode area on the wiring pattern and having insulating particles dispersed and included and a thermoplastic resin film covering the thermosetting resin film, while applying a ultrasonic wave, thereby inserting the bumps of the semiconductor bear chip through the thermoplastic resin film and the thermosetting resin film to bond the top end portion of the bump with the electrode area.

12 Claims, 20 Drawing Sheets

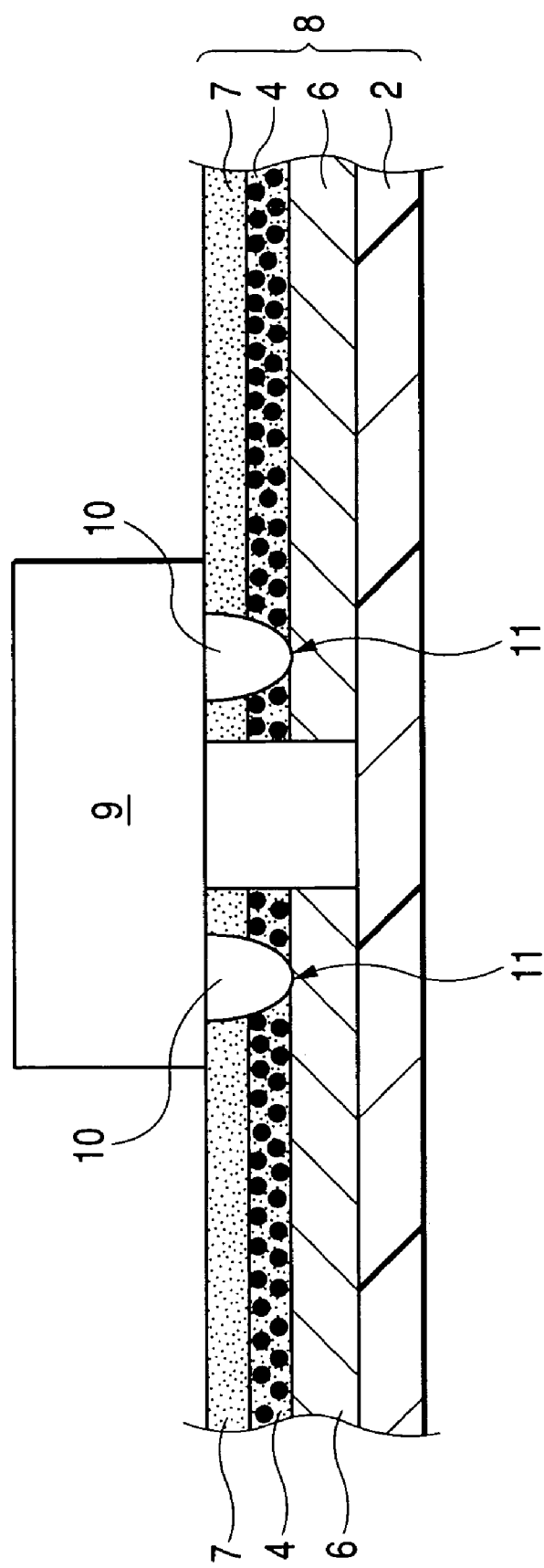

FIG. 6A

| SEMICONDUCTOR MOUNTING METHOD | ULTRASONIC BONDING | EMBODIMENT |
|---|---|---|
| BONDING STRENGTH | 200 ~ 250 | 1400 ~ 1700 |

FIG. 6B

| SEMICONDUCTOR MOUNTING METHOD | THIRD METHOD OF THE RELATED ART | EMBODIMENT |
|---|---|---|
| SHORT-CIRCUIT FAILURE OCCURRENCE RATIO | 5.0% | 0.0% |

FIG. 7A

| SiO2 PARTICLES | NONE | PRESENT (EMBODIMENT) |
|---|---|---|
| SEMICONDUCTOR CHIP BONDING FAILURE (100 TESTS) | 96.0% | 0.0% |

FIG. 7B

| SiO2 PARTICLES | 1 ~ 2μm | 3 ~ 4μm (EMBODIMENT) |
|---|---|---|
| SEMICONDUCTOR CHIP BONDING FAILURE (100 TESTS) | 50.0% | 0.0% |

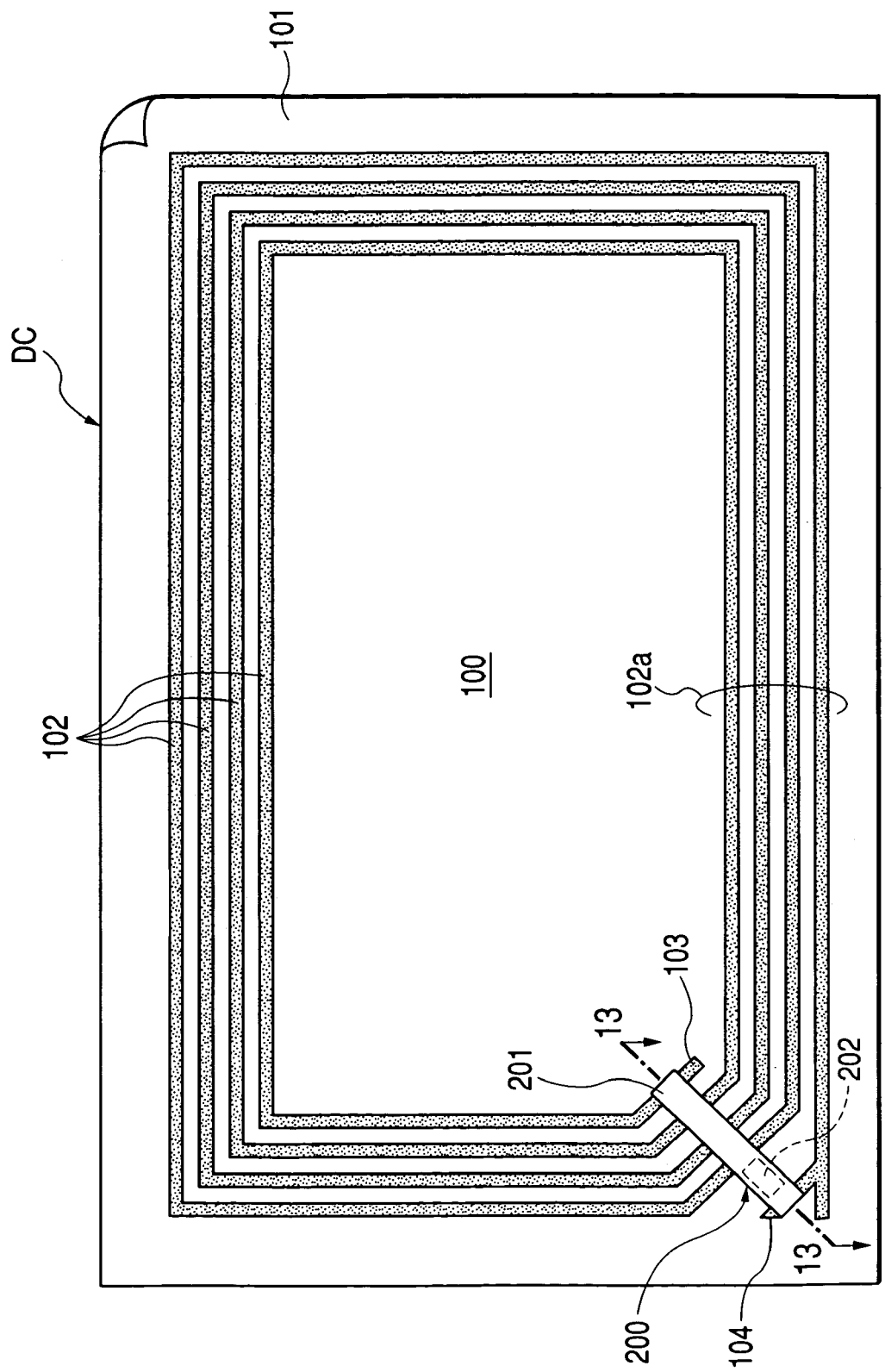

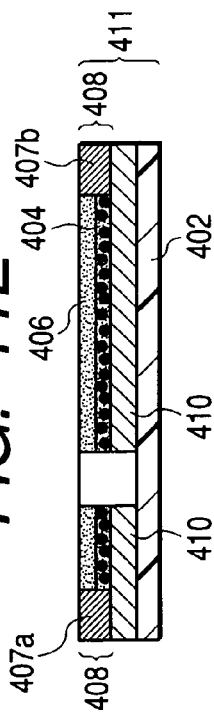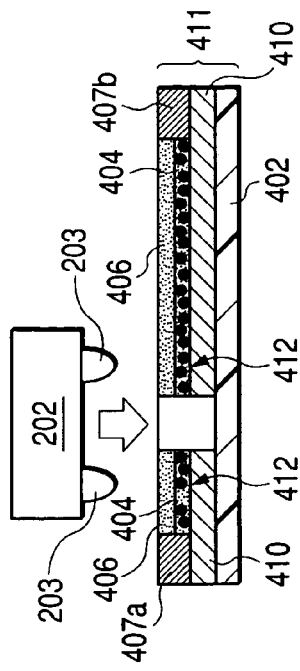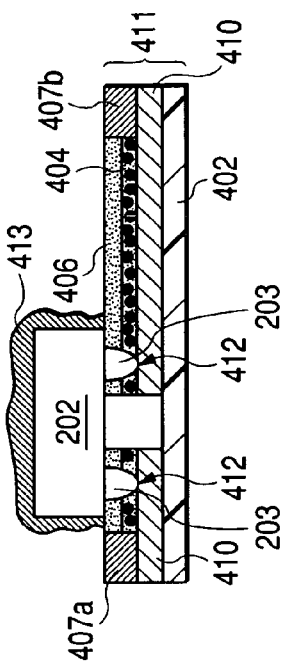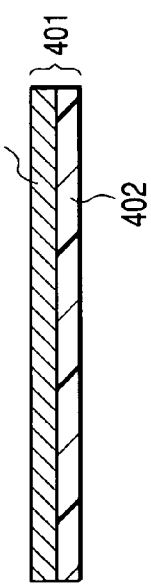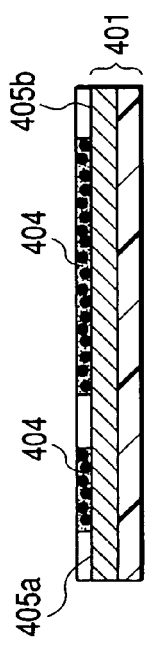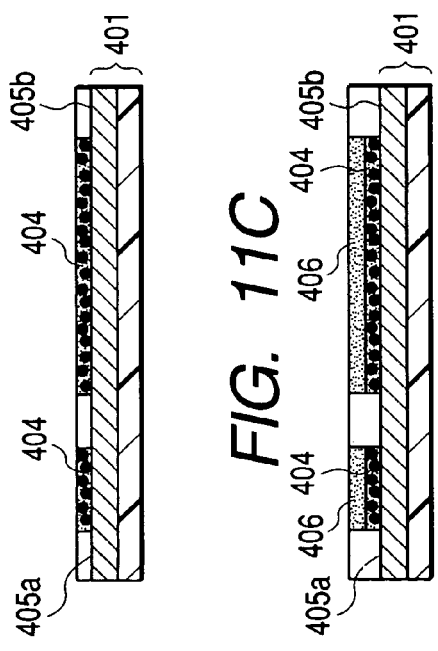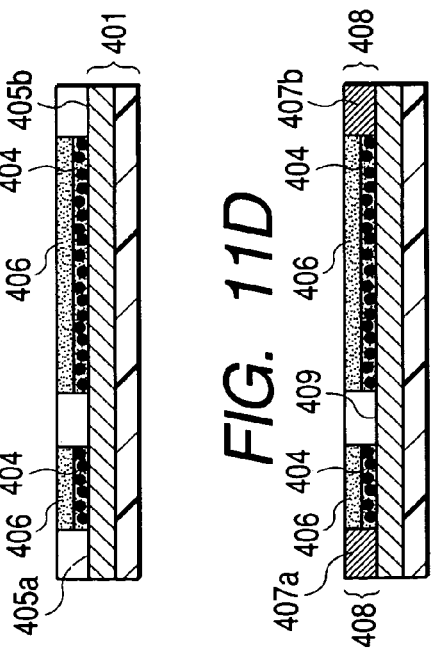

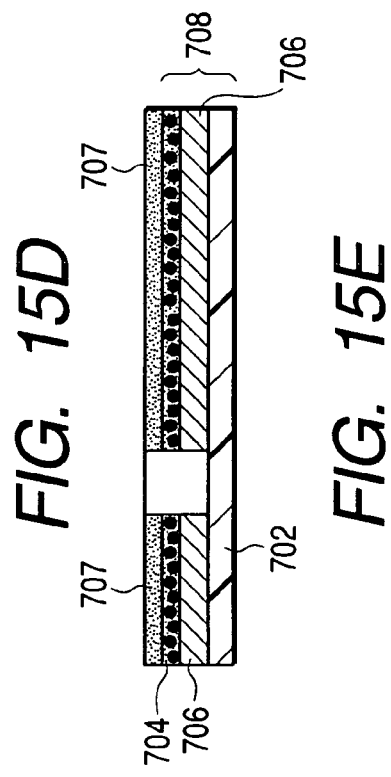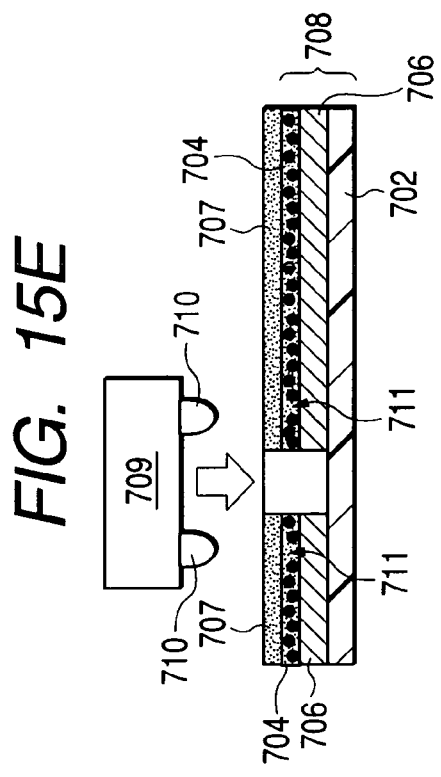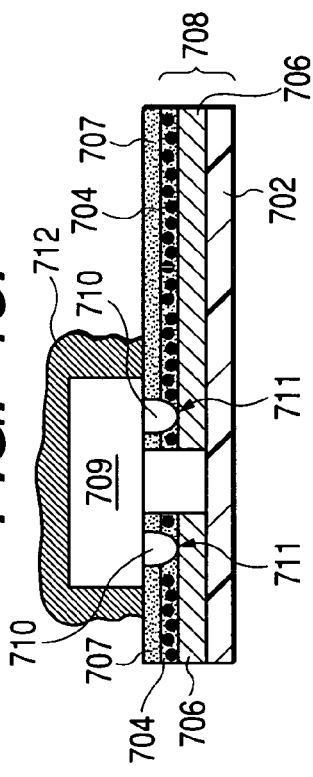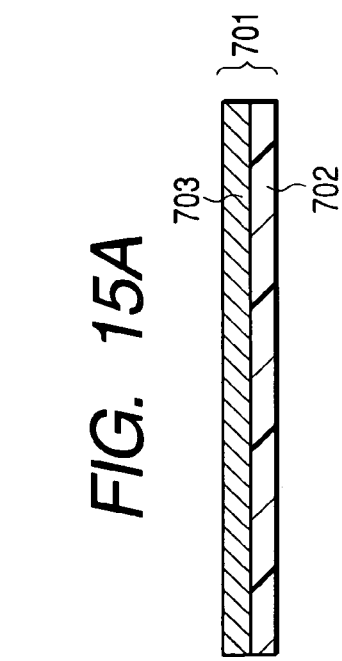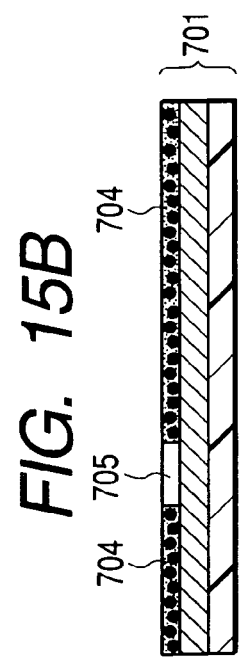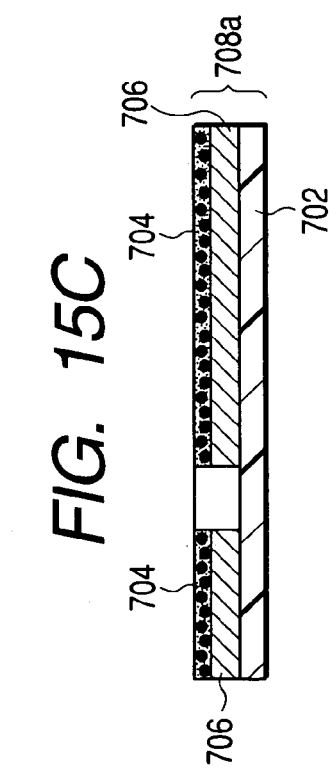

MANUFACTURING METHOD FOR ELECTRONIC COMPONENT MODULE AND ELECTROMAGNETICALLY READABLE DATA CARRIER

CROSS-REFERENCE TO RELATED APPLICATION

This application claims the benefit of Japan Patent Application No. 2002-364920, filed Dec. 17, 2002, the contents of which are hereby incorporated herein by reference in their entirety.

BACKGROUND OF THE INVENTION

1. Field of the Invention

The present invention relates to a method for manufacturing an electronic component module that is suitable for manufacturing an electromagnetically readable data carrier operating as an aircraft tag, a physical distribution management label or an unmanned wicket pass, and more particularly to a method for manufacturing an electronic component module in which a semiconductor bear chip is packaged on a wiring board by a flip chip connecting method at low cost, in which it is possible to prevent a short circuit from occurring due to a contact of the semiconductor bear chip with an electrode area on the wiring board even under a situation where a high temperature and high pressure load is applied on a packaged portion of the semiconductor bear chip.

2. Description of the Related Art

A so-called "aircraft tag" is well known as the electromagnetically readable data carrier of this type. It is expected that this aircraft tag is used in disposable manner for the management of customer luggage at the airport in the near future. There will be a great demand of 8,500,000 tags per month only in one company in the case of an aircraft company on a worldwide scale. Therefore, it is desired that a mass production technology is established with very low cost for the aircraft tag of this kind.

For example, an aircraft tag is well known in which a vortex conductor pattern serving as an antenna coil and the IC parts for a transmitting and receiving circuit and a memory are mounted on one face of a PET film substrate having a rectangular shape. In this aircraft tag, an aircraft tag main body holding the vortex conductor pattern serving as the antenna coil is formed by selectively etching a copper foil or aluminum foil attached on one face of the PET film. Therefore, a continuous production line based on the RTR (Roll To Roll) is easily realized through a resist formation process by a well-known photolithography technique and a subsequent wet etching process. On the other hand, the circuit parts serving as a transmitting and receiving circuit and a memory, which are packaged on the aircraft tag main body, are constructed in one chip, employing a semiconductor integration technique (e.g., refer to patent document 1).

The present applicant has previously offered a technique in which a semiconductor bear chip composing a transmitting and receiving circuit and a memory is packaged in advance on a film-like insulating wafer (a kind of wiring board) to make a module. This electronic component module is bonded onto a PET film composing the aircraft tag main body to increase the productivity of the aircraft tag (refer to document patent 2).

For an electronic parts mounting sheet requiring a high degree of thinness such as the electronic component module bonded on the aircraft tag, various proposals have been made regarding a flip chip connecting method for directly mounting a semiconductor bear chip on the wiring board.

FIG. 17 shows one example of the flip chip connecting method (hereinafter referred to as a first method of the related art). With this first method, a protruding terminal b (referred to as a bump) for connection is formed beforehand on a bottom electrode (not shown) of the semiconductor bear chip, and the bump b and an electrode area (scheduled connection area with the bump b) d on a wiring pattern of the wiring board c are aligned, and connected by a bonding material e such as solder or conductive paste.

The first method has several problems that (1) a process for supplying and curing the bonding material e for connecting the bump b and the electrode area d on the wiring pattern is complex, (2) a process for filling an insulating resin f called an under-fill between the chip a and the wiring board c and sealing a bump connecting portion is required to obtain a reliable moisture resistance of the bump connecting portion and a mounting strength of semiconductor, and (3) a process for filling and curing the insulating resin f as the under-fill is needed, thereby increasing the manufacturing cost.

FIG. 18 shows another example of the flip chip connecting method (hereinafter referred to as a second method of the related art). The second method solves the problems associated with the first method. The second method involves packaging a semiconductor bear chip on the wiring board employing an anisotropic conductive sheet. In the second method, an anisotropic conductive sheet g having conductive particles dispersed in the thermoplastic or thermosetting resin is interposed between the semiconductor bear chip a and the wiring board c. The electrical connection in the thickness direction is made with conductive particles h between the bump b and the electrode area d on the wiring pattern by flowing the resin owing to thermocompression bonding (e.g., refer to patent document 3).

In the second method, the alignment with the wiring pattern is relatively roughly made in packaging the semiconductor on the wiring board. The resin curing time is as short as 10 to 20 seconds. There is no need for using the sealant such as under-fill. Therefore, the manufacturing cost is reduced. On the contrary, there are still several problems that (1) the anisotropic conductive sheet g is relatively expensive, (2) the temperature higher than 200° C. is required for curing to disable the less heat-resistant board, (3) it takes 10 to 20 seconds to cure the resin material, though it is a relatively short time. It is difficult to simplify and make faster the process, and (4) the electrical connection between the bump and the wiring pattern is made by the contact of conductive particles dispersed in the resin material, with poor reliability of connection.

Thus, the present applicant has offered a flip chip connecting method (referred to as a third method of the related art). FIGS. 19A-19C show the flip chip connecting method according to the third method. With this third method, a semiconductor bear chip a formed with the bump b of semicircular section is packaged on a flip chip connecting wiring board having the wiring board c, the electrode area d on the wiring pattern formed on the wiring board c, and a thermoplastic resin film (resin adhesive) i covering the electrode area d.

More specifically, there are a process for positioning (positioning process) the bear chip a side (bump b) and the wiring board c (electrode area d)(FIG. 19A), a process for contacting (removal process of thermoplastic resin film) the bump b and the electrode area d by pressing the conductive bear chip a downward (arrow direction in FIG. 19B) to partly shove away the melted thermoplastic resin film i while applying ultrasonic wave to the bump b in a state where the thermoplastic resin film i is heated employing a heater table (FIG. 19B), a process for ultrasonically bonding (metal melting) (process of ultrasonic bonding) the bump b and the electrode area d by further applying ultrasonic wave continually in a state where the bump b and the electrode area d are contacted (FIG. 19C), and a process for bonding the semiconductor bear chip main body on the wiring board by cooling and solidifying the melted thermoplastic resin film (not shown) (refer to patent document 4).

With this third method, a series of packaging processes, including melting the thermoplastic resin film i, bonding the bump b and the electrode area d by applying ultrasonic wave to the bump b, and curing (cooling and solidifying) the thermoplastic resin film i, are performed within one to two seconds, whereby the manufacturing time is shortened. Owing to the metal melting bonding between the bump b and the electrode area d, the electrical connection has a reliability.

However, this third conventional method has the following problems.

FIGS. 20A-20B show an example of a method for working a card and a token included in the data carrier with the semiconductor bear chip mounted. FIG. 20A shows a method for working the card included in the data carrier by a laminate press. FIG. 20B shows a method for working the token included in the data carrier by injection molding. More specifically, with the working method as shown in FIG. 20A, the data carrier main body k with the semiconductor bear chip j mounted is sandwiched between two resin films 1-1, and in this state, pressed by a pair of metal plates m-m heated to a temperature of about 120° C. vertically with a pressure of 100 to 200 Kg/cm$^2$ to integrally bond two films 1-1 and the data carrier, whereby the card included in the data carrier is produced. With the working method as shown in FIG. 20B, the data carrier main body k with the semiconductor bear chip j mounted is disposed at a predetermined position within an inner cavity of a mold n, and in this state, a resin having a temperature of 250° C. is injected from a resin inlet hole p of the mold n under the pressure of 40 to 80 Kg/mm$^2$, whereby the token included in the data carrier is produced.

That is, in the electronic component module manufactured by the third conventional method, since the insulation between the semiconductor bear chip a and the electrode area d is made by the thermoplastic resin film i alone, as shown in FIG. 21A, if a high temperature load required in the workings such as laminate press and injection molding is applied on a packaged portion of the semiconductor bear chip a, the thermoplastic resin film i may be melted in some cases. In this state, if a high pressure is applied in a direction as indicated by the arrow in FIG. 21B, the electrode area d and the wiring board c are partly curved. Then, the semiconductor bear chip a is buried into the thermoplastic resin film i, resulting in a nonconformity that the semiconductor bear chip a and the electrode area d are contacted to cause a short-circuit.

[Document 1]
JP-A-6-243358
[Document 2]
JP-A-11-176022
[Document 3]
Japanese Patent No. 2586154
[Document 4]
JP-A-11-333409

SUMMARY OF THE INVENTION

It is an object of the invention to provide a method for manufacturing an electronic component module in which the semiconductor bear chip is packaged on the wiring board rapidly in electrically and mechanically reliable way and at low cost, in which it is possible to prevent a short-circuit from occurring due to a contact between the semiconductor bear chip and the electrode area on the wiring board even in a situation where a high temperature and high pressure load is applied on the packaged portion of the semiconductor bear chip.

It is another object of the invention to provide a flip chip connecting wiring board that is suitable for the method for manufacturing the electronic component module.

It is a further object of the invention to provide a method for manufacturing the flip chip connecting wiring board in which the wiring board is produced simply and at low cost.

Moreover, it is another object of the invention to provide a method for manufacturing an electromagnetically readable data carrier employing the flip chip connecting wiring board at low cost and in mass production, in which the electromagnetically readable data carrier serves as an aircraft tag, a physical distribution management label, or an unmanned wicket pass.

Other objects and effects of the invention will be apparent to those skilled in the art by reading the following embodiments.

The present invention provides a method for manufacturing an electronic component module having a semiconductor bear chip packaged on a wiring board, said method including:

(a) preparing said wiring board including a wiring pattern, a thermosetting resin film covering an electrode area on said wiring pattern and having insulating particles dispersed and included, and a thermoplastic resin film covering said thermosetting resin film;

(b) pressing a bump of the semiconductor bear chip onto the thermoplastic resin film in a melted state where said thermoplastic resin film is heated and softened, while applying a ultrasonic wave, so that the melted thermoplastic resin film is shoved away by said bump of the semiconductor bear chip and that said bump reaches a surface of said thermosetting resin film;

(c) pressing said bump against said thermosetting resin film by continually applying ultrasonic wave to said bump so that said insulating particles are separated from within the thermosetting resin film, the thermosetting resin film is shaved away by said bump, and said bump makes contact with said electrode area;

(d) ultrasonically bonding said bump and said electrode area by continually applying ultrasonic wave in a state where said bump and said electrode area are contacted; and (e) bonding a semiconductor bear chip main body on said wiring board by cooling and solidifying said melted thermoplastic resin.

As will be clear from the step (a), the thermosetting resin film having insulating particles dispersed and included is formed before hand on the electrode area on the wiring pattern of the wiring board as used in this invention. Moreover, the thermoplastic resin film is formed on this thermosetting resin film. The thermosetting resin film may cover only the electrode area of the wiring pattern, or the entire surface of the wiring pattern.

The "electrode area" as used herein means a certain small area on the wiring pattern including a predetermined position at which the terminal of electronic part is connected. This electrode area includes a portion typically referred to as a land on the wiring pattern.

The "heated and softened" as used herein means both a state where the thermoplastic resin film is heated and softened to some extent and a state where it is heated and melted. Moreover, the "thermoplastic resin" as used herein has preferably an excellent characteristic as the adhesive.

The "dispersed and included" means that a predetermined amount of insulating particles may exist at least near the electrode area (a bump insertion scheduled area in the thermosetting resin film. Further, The insulating particles uniformly may exist over the entire area of the thermosetting resin film. The insulating particles may be uniformly dispersed within the thermosetting resin film. Further, the insulating particles may be included to separate the insulating particles from within the thermosetting resin film by ultrasonic vibration of the bump, and produce the holes in the thermosetting resin film. That is, since the holes are produced within the thermosetting resin film, the thermosetting resin film is fragile in durability, whereby the bump is easily inserted through the thermosetting resin film.

The "separating the insulating particles from within the thermosetting resin film" as used herein includes both a case of fully separating the insulating particles from the thermosetting resin film and a case of protruding partially the insulating particles from the thermosetting resin film.

This method for manufacturing the electronic component module according to the present invention has the advantages that (1) the electrical conduction is securely made because the bump and the electrode area are subjected to diffused junction by ultrasonic bonding, (2) the moisture proof is excellent, because the junction portion between the bump and the electrode area is sealed by resin, (3) the mechanical packaging strength against tension is high, because the semiconductor bear chip and the wiring board are bonded when the thermoplastic resin film is cured, (4) electrical conduction and mechanical connection are made simultaneously in a short time, (5) the manufacturing cost is extremely low because any specific sealing and bonding process and the bonding material are unnecessary, and (6) the substrate surface is not stickier than necessary at the time of heating, because the thermoplastic resin film does not exist in an exposed portion of the board surface.

Though the advantages as cited in the above (1) to (6) are obtained greatly owing to the existence of the thermoplastic resin film covering the thermosetting resin film, they are the almost same advantages obtained by the third method of the related art (JP-A-11-333409) which the present applicant has previously offered. That is, an outstanding feature of the invention is that the method for manufacturing the electronic component module according to this invention has the following advantages in addition to the advantages as cited in the above (1) to (6).

(7) In the electronic component module manufactured according to the invention, because the thermosetting resin film typically not melting at high temperatures is interposed between the semiconductor bear chip and the electrode area (wiring pattern), the semiconductor bear chip and the wiring pattern are prevented from directly contacting due to existence of the thermosetting resin film, as previously described in connection with FIGS. 21A-21B, even if a high temperature and high pressure load is applied to the packaged portion of the semiconductor bear chip, as previously described in connection with FIG. 20A. Accordingly, the electronic component module that is highly reliable and has no fear of causing a short-circuit is fabricated.

(8) Because the thermosetting resin film has insulating particles dispersed and included, a process for removing the thermosetting resin film to insert the bump into the thermosetting resin film involves simply pressing the bump onto the thermosetting resin film by applying ultrasonic vibration to the bump. For example, to prevent the short-circuit, considering a case where an insulating film (insulating layer) not containing insulating particles is provided between the thermoplastic resin film and the wiring pattern, the insulating layer is not easily inserted (partially removed) only by ultrasonic vibration of the bump. On the contrary, in this invention, the insulating particles are separated from the thermosetting resin film by ultrasonic vibration of the bump, so that holes are produced in the thermosetting resin layer to make the resin layer fragile, making it possible to force the bump to creep into the thermosetting resin layer easily in a short time and cause the top end portion of the bump to reach the electrode area.

Further, this invention provides a flip chip connecting wiring board comprising a wiring pattern, a thermosetting resin film covering an electrode area on the wiring pattern and having insulating particles dispersed and included, and a thermoplastic resin film covering the thermosetting resin film.

Using this flip chip connecting wiring board, the semiconductor bear chip is easily mounted on the wiring board by ultrasonic packaging only by providing the semiconductor bear chip with predetermined bumps. And the excellent electronic component module having the advantages as cited in the above (1) to (6) is obtained.

To manufacture this flip chip connecting wiring board is manufactured, it is preferable that the thermosetting resin film having insulating particles dispersed and included is employed as the etching mask in forming the wiring pattern through the etching process, and the thermosetting resin film is covered with the thermoplastic resin film.

With this manufacturing method, the typical process for peeling the etching resist is eliminated, whereby the manufacturing process is simplified. Moreover, there is the effect that the etching resist acts as the insulating protective layer on the surface of the wiring pattern.

Further, this invention provides a method for manufacturing an electromagnetically readable data carrier including integrally a data carrier main body and an electric component module, said data carrier main body holding a conductor pattern composing an antenna on a film, said electric component module, in which a semiconductor bear chip having a transmitting/receiving circuit and a memory, being packaged on a wiring pattern of said film, sheet or thin plate like wiring board, said method having manufacturing method for said electric component module, including the steps of:

(a) preparing said film, sheet or thin plate-like wiring board having said wiring pattern, a thermosetting resin film covering an electrode area on said wiring pattern and having insulating particles dispersed and included and a thermoplastic resin film covering said thermosetting resin film;

(b) pressing a bump of the semiconductor bear chip onto the thermoplastic resin film in a melted state where said thermoplastic resin film is heated and softened, while applying a ultrasonic wave, so that the melted thermoplastic resin film is shoved away by said bump of the semiconductor bear chip and that said bump reaches a surface of said thermosetting resin film;

(c) pressing said bump against said thermosetting resin film by continually applying ultrasonic wave to said bump so that said insulating particles are separated from within the thermosetting resin film, the thermosetting resin film is shaved away by said bump, and said bump makes contact with said electrode area;

(d) ultrasonically bonding said bump and said electrode area by continually applying ultrasonic wave in a state where said bump and said electrode area are contacted; and (e) bonding a semiconductor bear chip main body on said wiring board by cooling and solidifying said melted thermoplastic resin.

With this constitution, owing to the advantages (1) to (8) as described above regarding the method for manufacturing the electronic component module, the electromagnetically readable data carrier of high performance operating as an aircraft tag, a physical distribution management label or an unmanned wicket pass is mass produced.

Preferably, this invention provides a method for manufacturing an electromagnetically readable data carrier comprising integrally a data carrier main body holding a metal pattern composing an antenna coil on a film like resin substrate, and an electronic component module in which a semiconductor bear chip composing a transmitting/receiving circuit and a memory is packaged on an aluminum foil wiring pattern on the surface of the film-like resin substrate, the method including a step of producing the electronic component module in which the semiconductor bear chip is packaged on the aluminum foil wiring pattern on the surface of the film-like resin substrate, said step further including (a) a step of preparing a wiring board having the aluminum foil wiring pattern, a thermosetting resin film covering an electrode area on the aluminum foil wiring pattern and having insulating particles dispersed and included and a thermoplastic resin film covering the thermosetting resin film, (b) a step of pressing a bump of the semiconductor bear chip onto the thermoplastic resin film in a melted state where the thermoplastic resin film is heated and softened, while applying a ultrasonic wave, and forcing the bump to shove away the melted thermoplastic resin film and reach a surface of the thermosetting resin film, (c) a step of pressing the bump against the thermosetting resin film by further applying ultrasonic wave to the bump continually, separating the insulating particles from within the thermosetting resin film, and forcing the bump to shove away the thermosetting resin film and make contact with the electrode area, (d) a step of ultrasonically bonding the bump and the electrode area by further applying ultrasonic wave continually in a state where the bump and the electrode area are contacted, and (e) a step of bonding a semiconductor bear chip main body on the wiring board by cooling and solidifying the melted thermoplastic resin.

According to an knowledge of the inventor, it has been confirmed that if the aluminum foil is employed as the wiring pattern on the side of the electronic component module in the above manner, the etching process and the ultrasonic bonding in the above process (d) are made relatively more easily and at lower cost than when other metals are employed.

As the material of "insulating particles" in the invention silicone oxide, aluminum oxide or tetrafluoroethylene may be employed. From the point of view of pressure proof, it is considered that silicone oxide or aluminum oxide that is an inorganic oxide having relatively high hardness is preferable. However, since aluminum oxide has a relatively high dielectric constant, silicone oxide is more preferable in the uses of disliking any capacitor component to be directly under the semiconductor bear chip. When it is required to cut the wiring board depending on the uses, there is a risk of shorting the life of a cutter knife, if hard particles of oxides such as silicone oxide or aluminum oxide are included in the thermosetting resin film. In such a case, tetrafluoroethylene that is relatively soft is preferably employed.

In this invention, preferably, the content of insulating particles in the thermosetting resin film is 10 to 30% wt in the 100 wt % of resin. This is obtained as a result of minute researches. It has been found that the bump is difficult to insert through the thermosetting resin film (i.e., electrical connection between the semiconductor bear chip and the electrode area) below 10 wt %, while the work ability of the resin is degraded beyond 30%.

In this invention, the diameters of insulating particles are preferably 70% or more of the thickness of the thermosetting resin film. This is because with the larger diameters of insulating particles, the holes within the resin that are produced in separating the insulating particles from the thermosetting resin film are larger, making it easier to insert the bump.

BRIEF DESCRIPTION OF THE DRAWINGS

FIG. 5 is a cross-sectional view showing the structure of an electronic component module according to the invention;

FIGS. 6A-6B are tables showing a bonding strength of the semiconductor bear chip in the electronic component module according to the invention and a short-circuit failure occurrence ratio;

FIGS. 7A-7B are tables showing a bonding failure occurrence ratio of the semiconductor bear chip in the electronic component module according to the invention;

FIG. 8 is a view showing one example of a data carrier;

FIGS. 11A-11G are views showing a manufacturing process of the electronic component module mounted on the data carrier;

FIGS. 15A-15F are views showing another manufacturing process of the electronic component module mounted on the data carrier;

THE DESCRIPTION OF THE PREFERRED EMBODIMENTS

Embodiments

A method for manufacturing an electronic component module according to a preferred embodiment of the present invention will be described below with reference to the accompanying drawings. The following embodiment constitutes only a part of the invention, but the scope of the invention may be defined only by the claims in the specification.

This embodiment involves a method for manufacturing an electronic component module in which a method for manufacturing an electronic component module having a semiconductor bear chip packaged on a wiring board, said method including:

preparing said wiring board including a wiring pattern, a thermosetting resin film covering an electrode area on said wiring pattern and having insulating particles dispersed and included, and a thermoplastic resin film covering said thermosetting resin film;

pressing a bump of the semiconductor bear chip onto the thermoplastic resin film in a melted state where said thermoplastic resin film is heated and softened, while applying a ultra sonic wave, so that the melted thermoplastic resin film is shoved away by said bump of the semiconductor bear chip and that said bump reaches a surface of said thermosetting resin film;

pressing said bump against said thermosetting resin film by continually applying ultrasonic wave to said bump so that said insulating particles are separated from within the thermosetting resin film, the thermosetting resin film is shaved away by said bump, and said bump makes contact with said electrode area;

ultrasonically bonding said bump and said electrode area by continually applying ultrasonic wave in a state where said bump and said electrode area are contacted; and bonding a semiconductor bear chip main body on said wiring board by cooling and solidifying said melted thermoplastic resin.

Figure 1A:
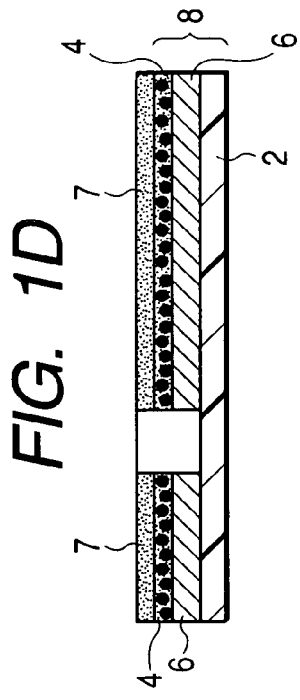
FIGS. 1A-1F are process views showing a method for manufacturing an electronic component module according to the present invention.
Figure 1D:
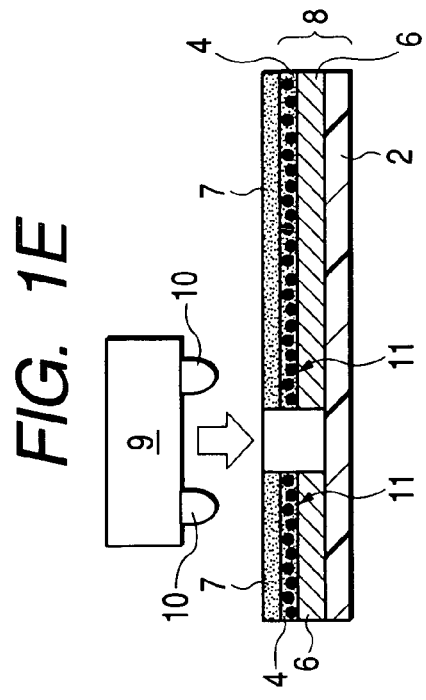
Figure 1E:
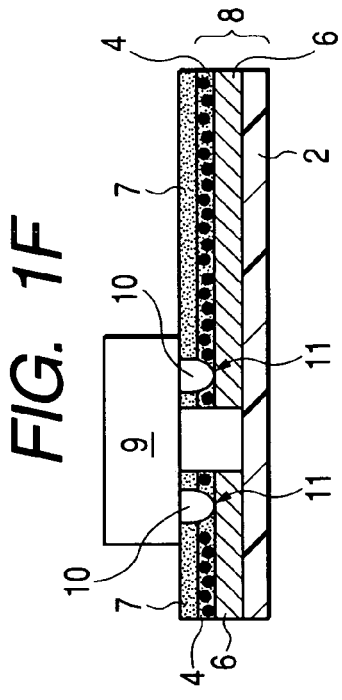
Figure 1B:
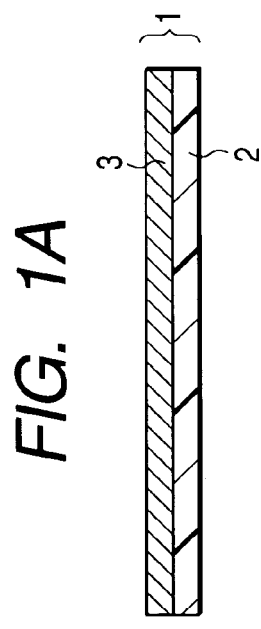
Figure 1C:
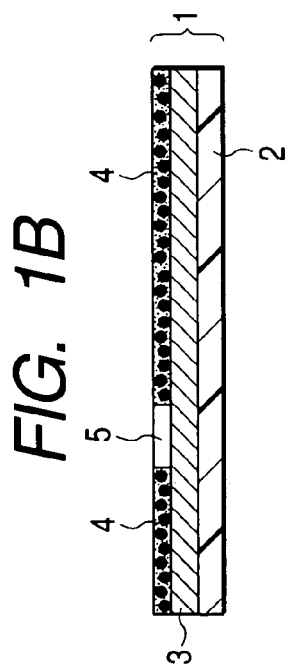
Figure 1F:
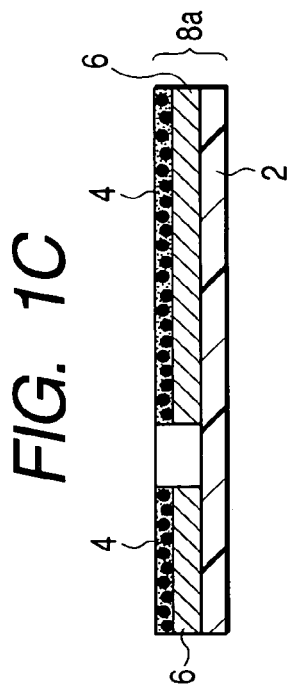

FIGS. 1A-1F are process views showing a series of processes in this manufacturing method. This series of processes include a metallic foil laminated board manufacturing process (FIG. 1A), an etching mask printing process (FIG. 1B), an etching process for wiring pattern formation (FIG. 1C), a thermoplastic film forming process (FIG. 1D), a ultrasonic packaging process FIG. 1E, and a bonding process (FIG. 1F). The details of each of the processes will be described below.

Metal foil laminated board manufacturing process In this process, an Al-PET laminated board 1 as a base member of the film-like wiring board is manufactured. This Al-PET laminated board 1 is manufactured by laying a hard aluminum foil 3 having a thickness of 35 μm via a urethane adhesive on one side (upper face in the figure) of a PET film 2 having a thickness of 25 μm, and heat laminating and bonding them under the condition of 150° C. and a pressure of 5 kg/cm².

Etching Mask Printing Process

In this process, an etching resist pattern having a required wiring pattern shape is formed on the surface of the hard aluminum foil 3 in the Al-PET laminated board 1. In this example, the resist pattern is formed as an epoxy thermosetting resin film 4 having $SiO_2$ particles (insulating particles) dispersed as indicated by "•" in FIGS. 1B-1F. More particularly, this epoxy thermosetting resin film (etching resist pattern) 4 is formed in a thickness of about 4 to 6 μm by coating an ink including epoxy resin 100 weight part and 30 weight part of $SiO_2$ particles having a particle diameter of 3 to 4 μm that are mixed into a solvent containing toluene 30%, methyl ethyl ketone 6.1% and butyl cellosolve 12% on the surface of the Al-PET laminated board 1 by gravure printing, and drying the ink at a temperature of 130 to 200° C. for 20 to 60 seconds.

Etching Process

In this process, an aluminum foil portion 5 exposed from the thermosetting resin film (etching resist pattern) 4 is removed by etching as well known to form the wiring pattern 6 including the hard aluminum foil 3. In this example, the formation of the wiring pattern 6 is made by dipping the aluminum foil portion 5 exposed from the thermosetting resin film 4 in an etchant of NaOH (120 g/l) at a temperature of 50° C. Thereby, the wiring pattern includes in the hard aluminum foil 3 appears on the surface of a wiring board unfinished product 8a obtained in this etching process. The surface of this wiring pattern 6 is totally covered with the epoxy thermosetting resin film 4 used as an etching resist pattern (etching mask). That is, the surface of at least the electrode area (a connection scheduled area with the bump of the semiconductor bear chip) in this wiring pattern 6 is covered with the thermosetting resin film 4. The coating thickness of the thermosetting resin film 4 is adjusted in accordance with the bump size and shape of the bear chip mounted.

Thermoplastic Resin Film Formation Process

In this process, the thermoplastic resin film 7 as an adhesive layer is formed on the entire surface of the thermosetting resin film 4 as an etching resist pattern. The formation of this thermoplastic resin film 7 is made by coating a polyorefine thermoplastic resin adhesive melted at a temperature of about 90 to 100° C., about 4 to 6 μm thick, on the surface of the thermosetting resin film 4 by gravure printing. That is, the surface of the thermosetting resin film 4 is totally covered with the thermoplastic resin film 7. Thereby, the flip chip connecting wiring board (wiring board for packaging the semiconductor bear chip) 8 is completed. The coating thickness of the thermoplastic resin film 7 is adjusted in accordance with the bump size and shape of the bear chip mounted.

Ultrasonic Packaging Process

In this process, the semiconductor bear chip 9 is packaged on the wiring board 8 while applying ultrasonic wave. This process includes a step (first step) of pressing a bump 10 of the semiconductor bear chip 9 onto the thermoplastic resin film 7 in a melted state where the thermoplastic resin film 7 is heated and softened, while applying a ultrasonic wave, and forcing the bump 10 to shove away the melted thermoplastic resin film 7 and reach a surface of the thermosetting resin film 4, a step (second step) of pressing the bump 10 against the thermosetting resin film 4 by further applying ultrasonic wave to the bump 10 continually to separate the insulating particles from the thermosetting resin film 4, and forcing the bump 10 to shove away the thermosetting resin film 4 and make contact with an electrode area 11, and a step (third step) of ultrasonically bonding the bump 10 and the electrode area 11 by further applying ultra sonic wave continually in a state where the bump 10 and the electrode area 11 are contacted.

In this example, the semiconductor bear chip is 150 µm thick, and constituted as a so-called surface packaging component in which the bump 10 as a metallic terminal for connection is jutted out from its bottom face. The bump 10 is plated with gold, and has a height of 14 µm and a width of 80 µm (80×80 µm).

Figure 2A:
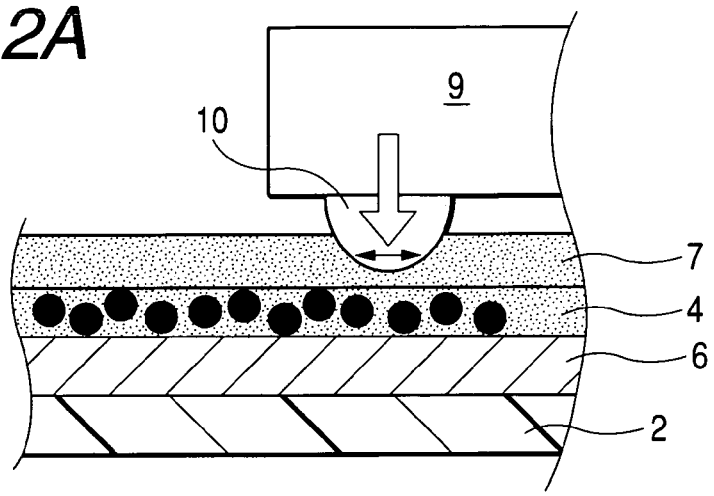
FIGS. 2A-2C are explanatory views showing a ultrasonic packaging process.
Figure 2B:
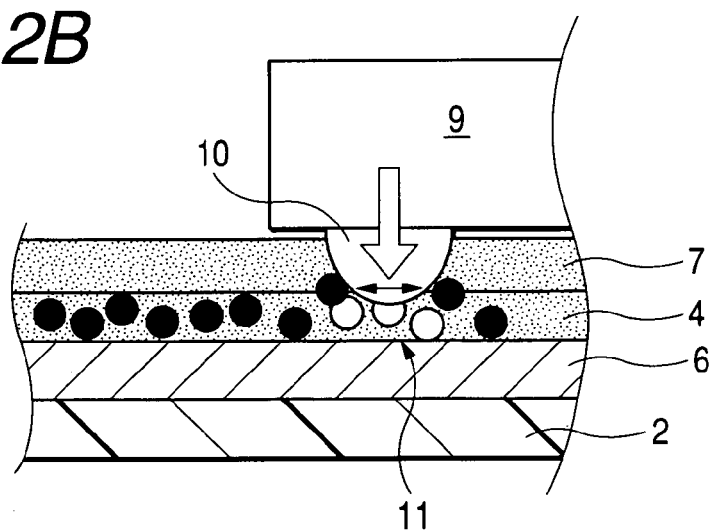
Figure 2C:
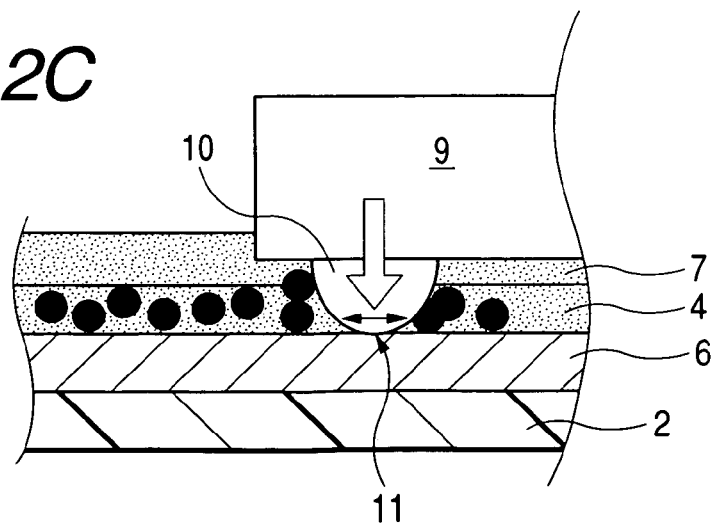

The details of the ultrasonic packaging process are shown in FIGS. 2A-2C. In the first step, the bump 10 is pressed against the thermoplastic film 7 heated and melted at a temperature of 150° C. in a state where ultrasonic vibration is applied. Then, the melted thermoplastic resin film 7 is partially shoved away and removed from a top end position of the bump 10 owing to ultrasonic vibration of the bump 10, as shown in FIG. 2A, so that the bump 10 reaches the surface of the thermosetting resin film 4 having $SiO_2$ particles dispersed and included. In the second step, the bump 10 is pressed against the thermosetting resin film 4 in a state where ultrasonic vibration is further applied to the bump 10. Then, $SiO_2$ particles as indicated by "•" are swept up (separated) from within the thermosetting resin film 4 by the bump 10, so that holes as indicated by "O" are formed within the thermosetting resin film 4, as shown in FIG. 2B. The $SiO_2$ particles separated from the thermosetting resin film 4 may be possibly absorbed (creep) into the melted thermoplastic resin film 7. Due to this occurrence of holes, the thermosetting resin film 7 is more fragile in durability, so that the bump 10 easily shoves (partially removes) the thermosetting resin film 4 to reach the surface (electrode area 11) of the aluminum foil wiring pattern 6. At this time, an oxide layer on the surface of the aluminum foil wiring pattern 6 is mechanically removed by ultrasonic vibration of the bump 10. Consequently, the bump 10 and the electrode area 11 are contacted. In the third process as shown in FIG. 2C, the bump 10 and the electrode area 11 of the wiring pattern 6 are heated by a frictional heat generated by ultrasonic vibration of the bump, so that a metallic fusion portion having gold atoms diffused in the aluminum foil is formed to complete the ultrasonic bonding of both.

The first to third steps in the ultrasonic packaging process are completed by applying a ultrasonic vibration at a frequency of 63 KHz under a load pressure of 0.2 kg/mm² for about 1.5 seconds after the semiconductor bear chip 9 is disposed at a predetermined position.

Figure 3A:
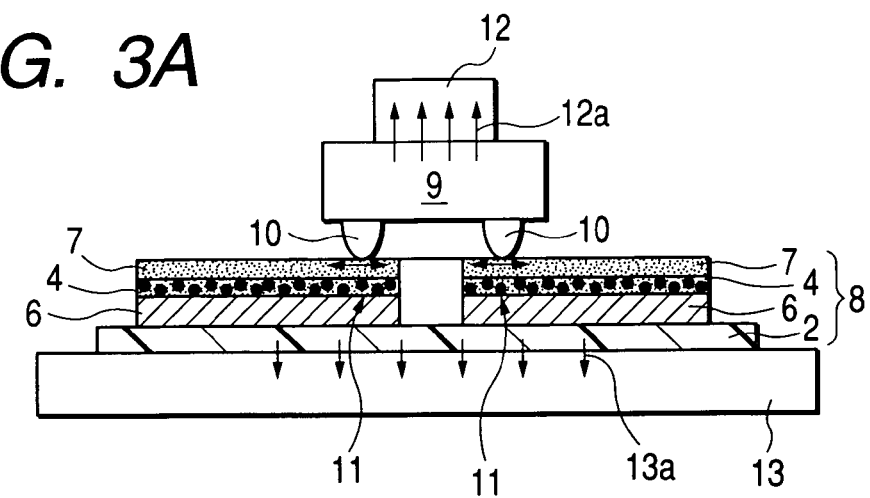
FIGS. 3A-3C are explanatory views showing the details of the ultrasonic packaging process.
Figure 3B:
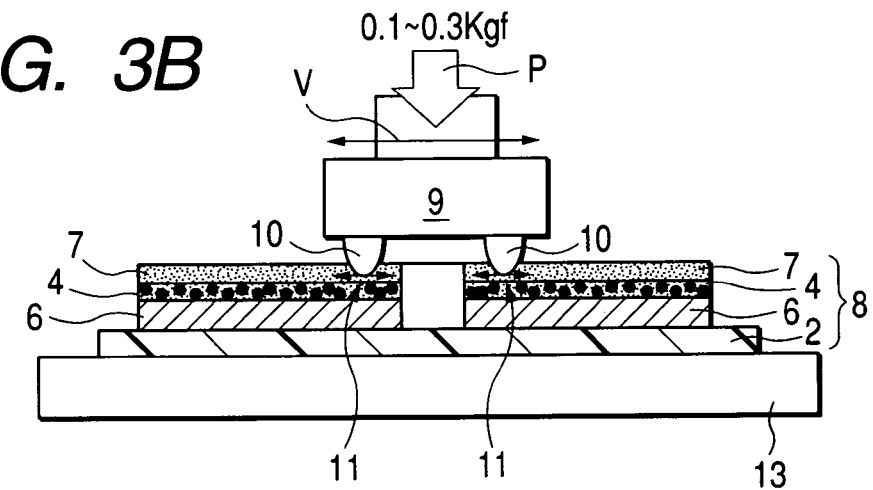
Figure 3C:
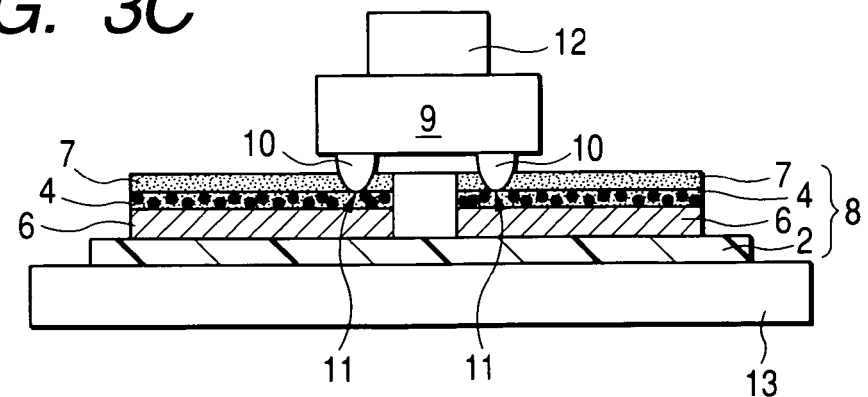
Figure 4A:
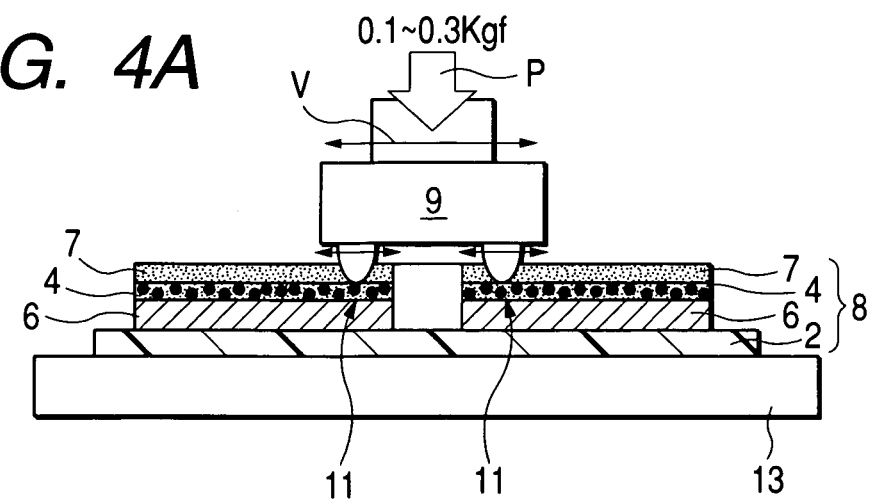
FIGS. 4A-4C are explanatory views showing the details of the ultrasonic packaging process.
Figure 4B:
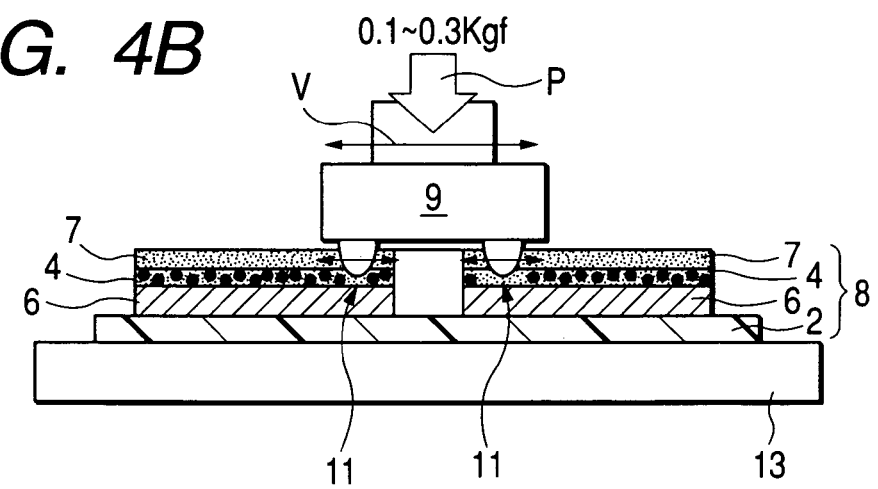
Figure 4C:
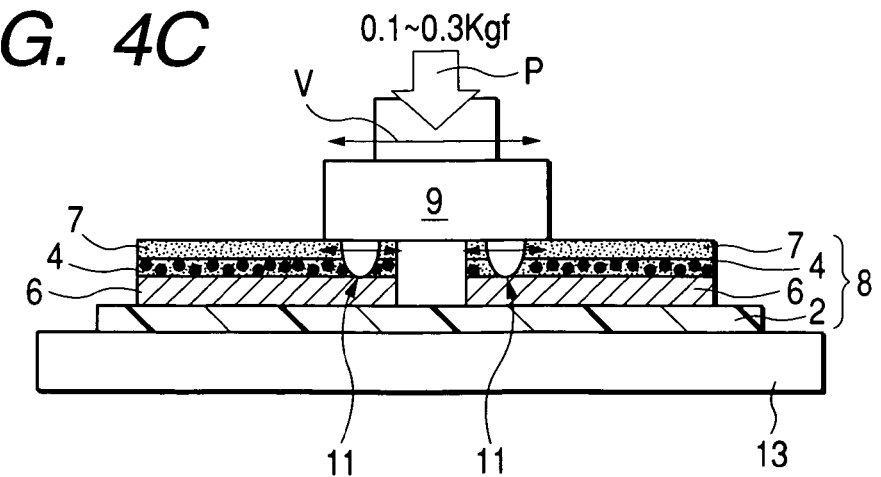

The details of this ultrasonic packaging process are shown in the process views of FIGS. 3A-3C and 4A-4C. FIGS. 3A-3C are process views for explaining the details of the first step, and FIGS. 4A-4C are process views for explaining the details of the second and third steps.

Referring to FIGS. 3A-3C the details of the first step will be described below. At a positioning step as a packaging preparation phase, a ultrasonic horn 12 and a heater table and anvil 13, each of which has a vacuum adsorption feature, are vertically opposed to each other, as shown in FIG. 13A, in which the ultrasonic horn 12 adsorbs and holds the bear chip 9 as indicated by the arrow 12a, and the heater table and anvil 13 adsorbs and holds the wiring board 8 as indicated by the arrow 13a in FIG. 3A. In this state, the ultrasonic horn 12 and the heater table and anvil 13 are relatively moved horizontally to position the bump 10 on the bear chip 9 with the electrode area 11 of the wiring pattern 6 on the wiring board 8, while at the same time heating the wiring board 8 to 150° C., employing the heater table and anvil 13.

In a partial removal process of the thermoplastic resin film as shown in FIG. 3B, the bump 10 of the bear chip is pressed against the thermoplastic resin film 7 in the heated and softened state under a load pressure (0.1 to 0.3 Kgf) as indicated by the arrow P, while applying a ultrasonic vibration (63.5 KHz, 2W) as indicated by the arrow V employing the ultrasonic horn 12 and the heater table and anvil 13. Thereby, the thermoplastic resin film 7 is partially shoved (removed) to bury the top end portion of the bump 10 in the thermoplastic resin film 7, and force the top end portion of the bump 10 to contact (reach) the surface of the thermosetting resin film 4, as shown in FIG. 3C.

Referring now to FIGS. 4A-4C, the details of the second and third steps will be described below. The bump 10 contacting (reaching) the surface of the thermosetting resin film 4 is continually subjected to ultrasonic vibration (63.5 KHz, 2 W) as indicated by the arrow V and a load pressure (0.1 to 0.3 Kgf) as indicated by the arrow P, as shown in FIG. 4A. Thereby, SiO2 particles are separated from within the thermosetting resin film 4, and the thermosetting resin film is shoved (see FIG. 4B) to force the bump 10 to contact (reach) the electrode area 11 (surface of the aluminum foil wiring pattern 6), as previously described. In a subsequent ultrasonic bonding step (see FIG. 4C), the intermetallic diffused junction is caused to progress between the top end portion of the bump 10 and the electrode area by further applying ultrasonic vibration v continually, thereby ultrasonic bonding the bump 10 and he electrode area 11.

Turning back to FIG. 1E, explanation is continued.

Bonding Process (E)

In this process, the melted thermoplastic resin film 7 is recured by natural cooling or forced cooling without heating the wiring board 8 to 150° C. to bond the main body of the semiconductor bear chip 9 and the wiring pattern 6. That is, the melted thermoplastic resin film 7 interposed between the bottom face of the semiconductor bear chip 9 and the wiring board 8 is cooled and solidified, so that the semiconductor bear chip 9 and the wiring board 8 are firmly bonded.

FIG. 5 is a cross-sectional view showing the structure of the electronic component module completed through the above processes as shown in FIGS. 1A to 1E. This method for manufacturing the electronic component module has the advantages that (1) the electrical conduction is securely made because the bump 10 and the electrode area 11 are subjected to diffused junction by ultrasonic bonding, (2) the moisture proof is excellent, because the junction portion between the bump 10 and the electrode area 11 is sealed by resin, (3) the mechanical packaging strength against tension is high, because the semiconductor bear chip 9 and the wiring board 8 are bonded when the thermoplastic resin film 7 is cured, (4) electrical conduction and mechanical connection are made simultaneously in a short time, (5) the manufacturing cost is extremely low because any specific sealing and bonding process and the bonding material are unnecessary, and (6) the substrate surface is not stickier than necessary at the time of heating, because the thermoplastic resin film does not exist in an exposed portion of the board surface.

Though the advantages as cited in the above (1) to (6) are obtained greatly owing to the existence of the thermoplastic resin film 7, they are the almost same advantages obtained by the third conventional method (JP-A-11-333409) which the present applicant has previously offered. That is, an outstanding feature is that the method for manufacturing the electronic component module according to this embodiment has the following advantages in addition to the advantages as cited in the above (1) to (6).

Figure 20A:
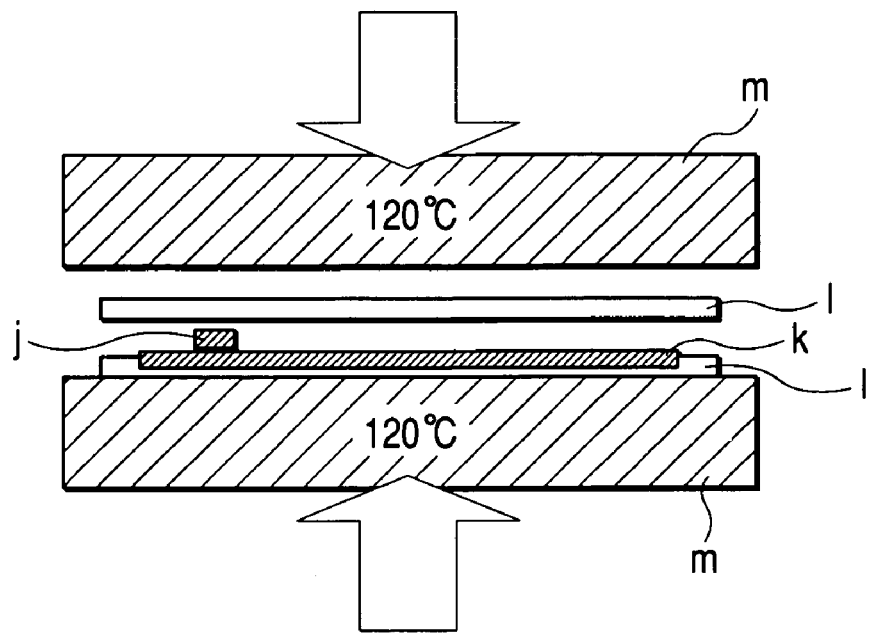
FIGS. 20A-20B are views showing sample of processing a data carrier containing product in the third method.
Figure 20B:
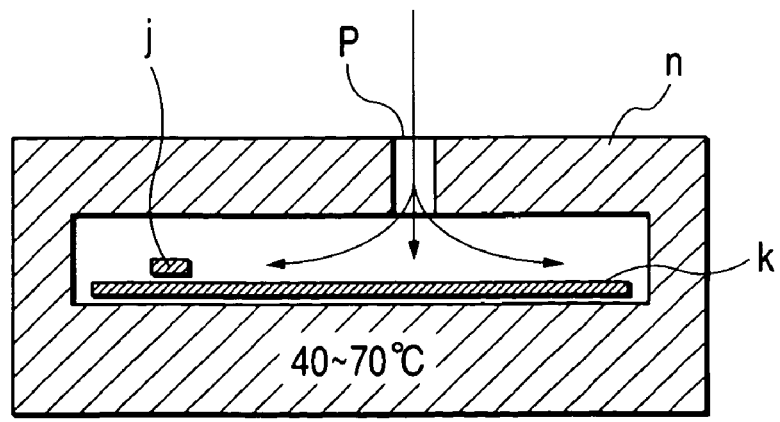
Figure 21A:
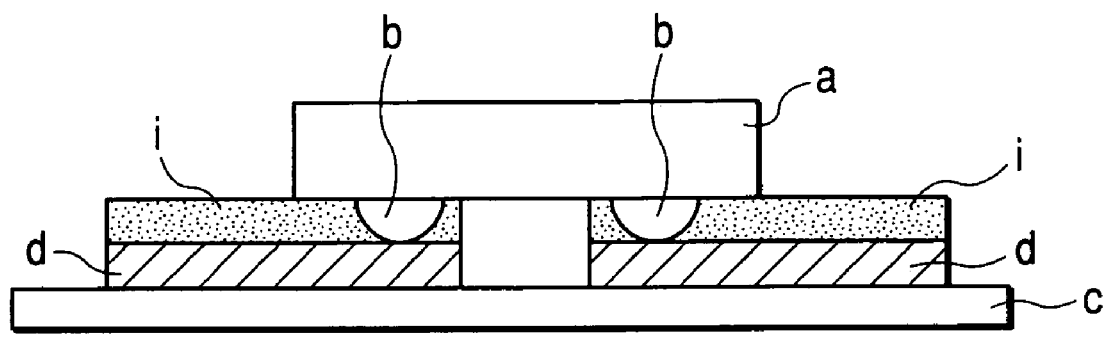
FIGS. 21A-21B are views showing a problem associated with the third method.
Figure 21B:
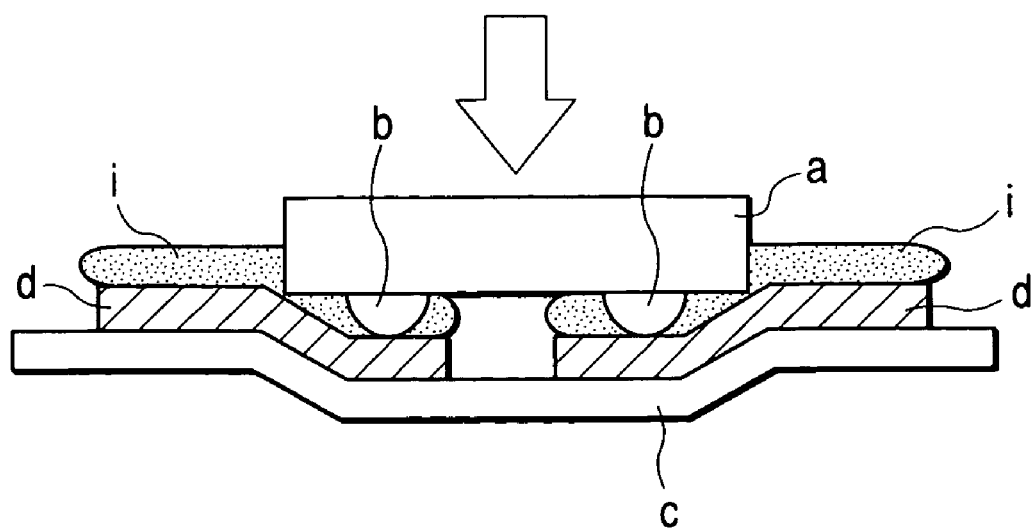

(7) Because the thermosetting resin film 4 not melting at high temperatures (in a range from 150° C. to 250° C. in this example) is interposed between the semiconductor bear chip 9 and the aluminum foil wiring pattern 6, the semiconductor bear chip and the aluminum foil wiring pattern are prevented from contacting due to existence of the thermosetting resin film 4 as previously described in connection with FIGS. 21A-21B, even if a high temperature and high pressure load is applied to the semiconductor packaging portion, as previously described in connection with FIG. 20. Accordingly, the electronic component module that is highly reliable and has no fear of causing a short-circuit is fabricated.

(8) Because the thermosetting resin film 4 formed in manufacturing the electronic component module has $SiO_2$ particles dispersed and included, a partial removal process for removing the thermosetting resin film 4 to cause the bump 10 to creep involves simply pressing the bump onto the thermosetting resin film 4 by applying ultrasonic vibration to the bump 10. For example, to prevent the short-circuit, considering a case where an insulating film (insulating layer) not containing insulating particles such as $SiO_2$ particles is provided between the thermoplastic resin film 7 and the aluminum foil wiring pattern 6, the insulating layer is not easily removed only by ultrasonic vibration of the bump 10. On the contrary, in the above embodiment, the insulating particles ($SiO_2$ particles) are separated from the thermosetting resin film 4 by ultra sonic vibration of the bump 10, so that holes are produced in the thermosetting resin layer 4 to make the resin layer 4 fragile, making it possible to force the bump 10 to creep into the thermosetting resin layer 4 easily in a short time (about one second) and cause the top end portion of the bump 10 to reach the aluminum foil wiring pattern 6 (electrode area).

FIG. 6A shows the bonding strength between the semiconductor bear chip 9 and the wiring pattern 6 in the electronic component module that is fabricated in this embodiment, as compared with the case where the ultrasonic bonding is only employed. As will be apparent from FIG. 6A, when the method for manufacturing the electronic component module of this invention was employed, the electronic component module had a bonding strength about 7 times (5.6 to 8.5 times) that of the case where the ultrasonic bonding was only employed. This is greatly due to the fact that the semiconductor bear chip 9 and the wiring board 8 are bonded when the thermoplastic resin film 7 is cured, but the existence of the thermosetting resin film 4 may contribute to it.

The short-circuit failure occurrence ratio of the electronic component module (electronic component module without the thermosetting resin film 4 having $SiO_2$ particles dispersed) manufactured by the third method of the related art and that of the electronic component module manufactured in this embodiment are shown in FIG. 6B, when they are subjected to a laminating press process with a temperature of 150° C. and a pressure of 2 $Kg/cm^2$. As shown in FIG. 6B, a failure occurred at a ratio of 5 of the 100 test object modules (5%) in the third conventional method, while no short-circuit failure occurred (short-circuit failure occurrence ratio 0%) in this embodiment. In this manner, the electronic component module that can fully withstand the process with the high temperature and high pressure load can be obtained in this embodiment.

The bonding failure occurrence ratio of the semiconductor bear chip in this embodiment in which the thermosetting resin film 4 (insulating layer having $SiO_2$ particles dispersed and included) is employed as the insulating layer between the thermoplastic resin film 7 and the aluminum foil wiring pattern 6, and the bonding failure occurrence ratio of the semiconductor bear chip in which the thermosetting resin film without containing $SiO_2$ particles is employed as the insulating layer are shown in FIG. 7A. As will be apparent from FIG. 7A, the packaging of the semiconductor bear chip 9 on the wiring board 8 by applying ultrasonic wave to the bump 10 is allowed by employing the thermosetting resin film 4 having $SiO_2$ particles dispersed and included (without $SiO_2$ particles: failure occurrence ratio 96%, with $SiO_2$ particles: failure occurrence ratio 0%).

In the above embodiment, the bonding failure occurrence ratio of the semiconductor chip due to differences in the diameter of $SiO_2$ particles dispersed and included in the thermosetting resin film 4 is shown in FIG. 7B. As shown in FIG. 7B, when the diameter of $SiO_2$ particles was 1 to 2 μmm (about 30% of the thickness (4 to 6 μmm) of the thermosetting resin film 4), a bonding failure occurred at a percentage of 50%. On the other hand, when the diameter of $SiO_2$ particles was 3 to 4 μmm (about 70% of the thickness (4 to 6 μmm) of the thermosetting resin film 4), no bonding failure occurred. From this, it will be found that the diameter of $SiO_2$ particles is preferably 70% or more of the thickness of the thermosetting resin film 4.

In the above embodiment, the PET film as the resin base material composing the laminated board 1 is employed, but a polyimide film may be employed instead of the PET film.

In the above embodiment, the ink having 30 weight % of $SiO_2$ particles mixed into 100 weight % of the epoxy resin is employed in forming the thermosetting resin film 4. However, as a result of acute research, the inventor has found that the ultrasonic packaging of the semiconductor bear chip is excellently practiced so long as the mixture ratio of the epoxy resin and the $SiO_2$ particles is 10 to 30 weight % Of $SiO_2$ particles with respect to 100 weight % of the epoxy resin.

In the above embodiment, $SiO_2$ (silica) is employed as the material of insulating particles dispersed and included in the thermosetting resin film 4, but $AlO_3$ (alumina) or tetrafluoroethylene may be employed. In other words, when it is necessary to cut out the wiring board 8 according to the purpose, there is a fear that the life of a cut edge is shortened, if hard oxide particles such as $SiO_2$ particles or $AlO_3$ particles are included in the thermosetting resin film 4. In such a case, it is preferable to employ tetrafluoroethylene that is relatively soft.

In the above embodiment, the thermosetting resin film 4 is employed as the insulating layer between the thermoplastic resin film 7 and the aluminum foil wiring pattern 6. However, the insulating layer maybe the thermoplastic resin film (i.e., capable of maintaining the cured state even if the thermoplastic resin film 7 is melted at high temperatures required in the laminating press or injection molding process as shown in FIGS. 20A-20B) having a fully higher resoftening point than the thermoplastic resin film 7. Of course, in this case, $SiO_2$ particles (insulating particles) are included in the insulating layer. The wiring board in this case may be generalized as the flip chip connecting semiconductor chip comprising the wiring pattern, the first thermoplastic resin film covering the electrode area on the wiring pattern and having insulating particles dispersed and included, and the second thermoplastic resin film covering the first thermoplastic resin film, wherein the first thermoplastic resin film has a fully higher resoftening point than the second thermoplastic resin film. On the other hand, the wiring board 8 in this embodiment may be generalized as the flip chip connecting wiring board comprising the wiring pattern 6, the thermosetting resin film 4 covering the electrode area 11 on the wiring pattern 6 and having insulating particles dispersed and included, and the thermoplastic resin film 7 covering the thermosetting resin film. With these wiring boards, the semiconductor bear chip 9 with bump is packaged by applying ultrasonic wave easily and at low cost, whereby the electronic component module that has a high bonding strength and is high reliable without causing short-circuit even if high temperature and high pressure load is applied.

The method for manufacturing the wiring board as shown in FIGS. 1B, 1C and 1D may be generalized as the method for manufacturing the flip chip connecting wiring board in which the thermosetting resin having insulating particles dispersed and included is employed as an etching mask in forming the wiring pattern through the etching process, and the thermosetting resin is covered with the thermoplastic resin. And with such a constitution, the etching mask employed in the etching process to form the wiring pattern becomes directly the thermosetting resin film composing the flip chip connecting wiring board, whereby the wiring board is produced without need for removing the etching mask, with less trouble, and at low cost.

Referring to FIGS. 8 to 12, a method for manufacturing a data carrier according to one embodiment of the invention will be described below. This data carrier is electromagnetically readable to operate as an aircraft tag, a physical distribution management label or an unmanned wicket pass. And this data carrier integrally comprises a data carrier main body holding a metallic pattern composing an antenna coil on a film-like resin base board, and an electronic component module having a semiconductor bear chip composing a transmitting and receiving circuit and a memory packaged in an aluminum foil wiring pattern on the surface of the film-like resin base board.

FIG. 8 shows one example of the data carrier according to the embodiment. As shown in FIG. 8, the data carrier DC includes a data carrier main body 100 holding a copper foil vortex conductor pattern (corresponding to an antenna coil) having a thickness of 10 µm on one side of the PET (polyethylene terephthalate) base board 101 having a thickness of 25 µm, and an electronic component module 200 having a semiconductor bear chip 202 packaged on the lower side of a glass epoxy wafer 201 having a thickness of 70 µm. And the electronic component module 200 is mounted on the data carrier main body 100 so that the wafer 201 strides (or crosses) a surrounding conductor bundle 102a composing a vortex conductor pattern, in which its electrical connection with the vortex conductor pattern 102 is made using an inner circumferential terminal pad 103 and an outer circumferential terminal pad 104 in the vortex conductor pattern 102.

Figure 9:
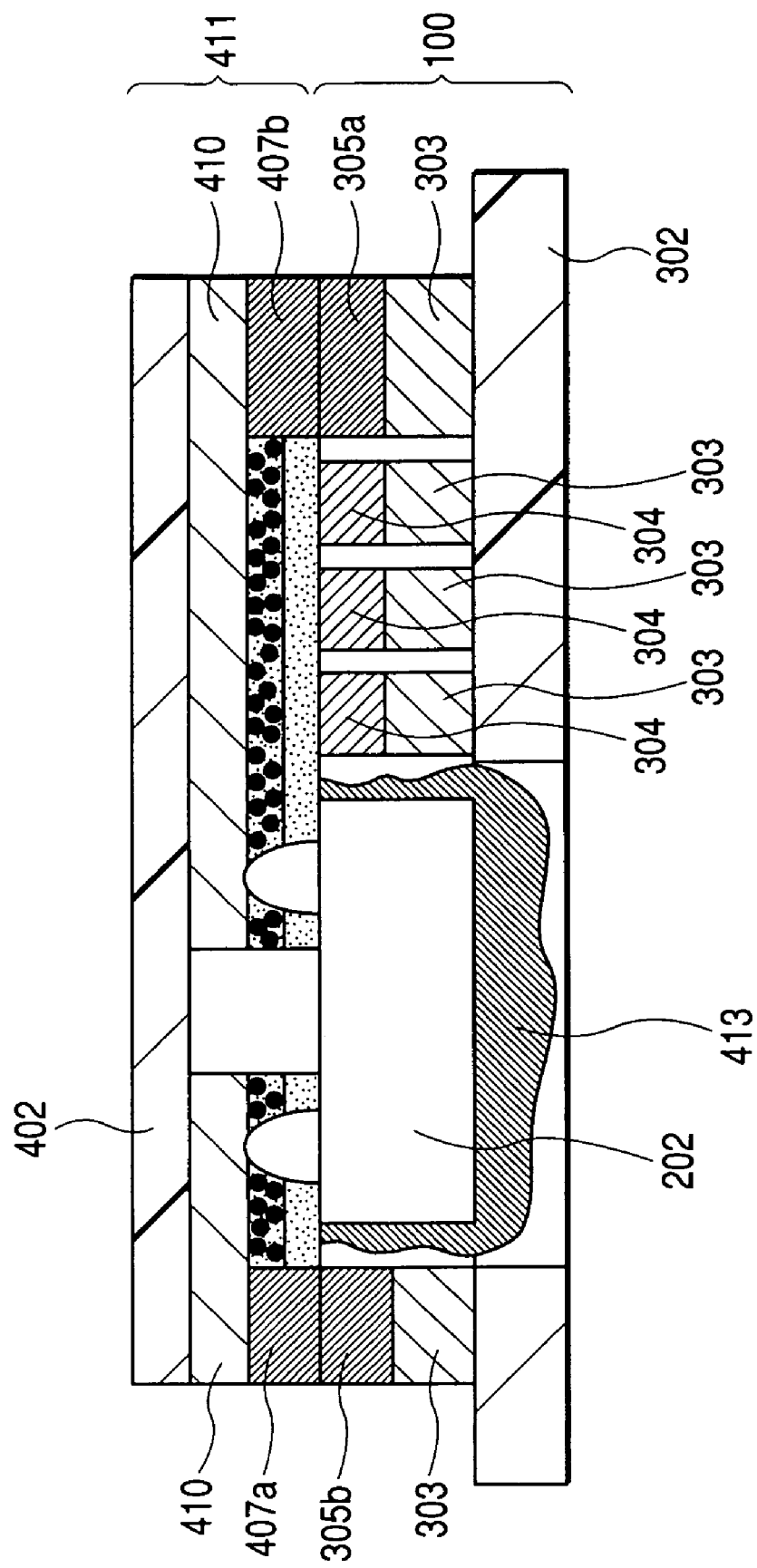
FIG. 9 is a cross-sectional view of the electronic component module packaged on the data carrier.

FIG. 9 is an enlarged cross-sectional view showing one example of a packaging structure of the electronic component module 200 (cross-sectional view of FIG. 8 taken along the line 13-13). The method for manufacturing the data carrier main body 100 and the electronic component module 200 as shown in FIGS. 8 and 9 will be described below in succession.

FIGS. 10A-10E show one example of a manufacturing process of the vortex conductor pattern 102 composing the antenna coil. Referring to FIGS. 10A-10E, the process for forming the vortex conductor pattern 102 as the antenna coil on one side of the PET film base board 101 will be described below.

Figure 10A:
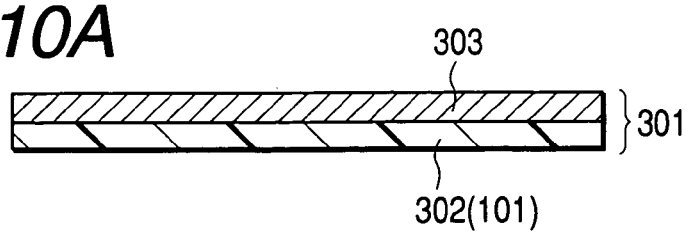
FIGS. 10A-10E are views showing a manufacturing process of the data carrier main body.

First of all, a Cu-PET laminate base board 301 is prepared as shown FIG. 10A. As one example, this Cu-PET laminate base board 301 is produced by laying a copper foil 303 having a thickness of 10 µm via a urethane adhesive on one side of a PET film 302 having a thickness of 25 µm, and heat laminating and bonding them under the condition of a temperature of 150° C. and a pressure of 5 kg/cm$^2$.

Figure 10B:
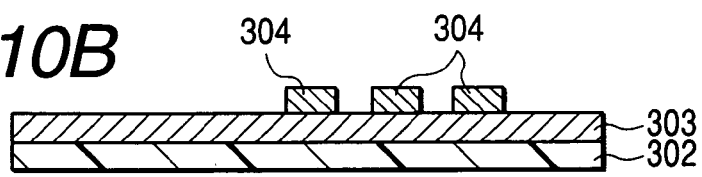

An etching resist pattern 304 of vortex shape is formed on the surface of the copper foil 303 in the Cu-PET laminate board 301 as shown FIG. 10B. That is, an insulating etching resist ink is printed on the copper foil 303 of the vortex shape having the turn number providing the L value and the Q value, line width, pitch, and inner and outer circumferences required for the coil characteristics by offset printing. At this time, the resist ink may be cured by a heat ray or an active energy beam. The active energy beam is ultraviolet or electron beam, and when ultraviolet ray is employed, a photo-polymerization agent is mixed in the resist ink.

Figure 10C:
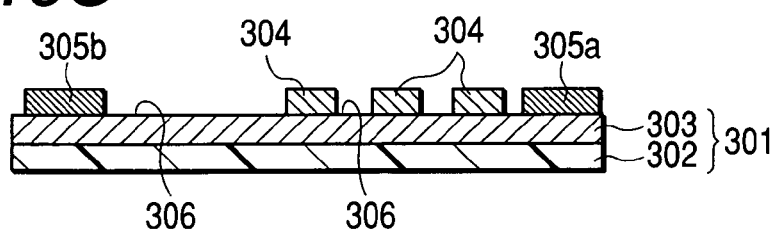

As shown FIG. 10C, at a site of making electrically conductive connection with the electrode of the electron parts module 200 on the surface of the copper foil 303 in the Cu-PET laminated board 301, the conductive etching resist pattern 305a, 305b (103, 104 in FIG. 8) with a required shape of electrode is formed by conductive ink. The formation of this resist pattern 305a, 305b is made by offset printing as in the previous process, and the resist ink may be a thermosetting conductive adhesive that is cured by heat treatment at a temperature of 120° C. for about 20 minutes. The printing of the conductive ink in this process may be performed by screen printing generally employed, and the ink material may be a mixture of Ag particles and thermoplastic adhesives, containing a photo-polymerization agent, or a solder paste.

Figure 10D:
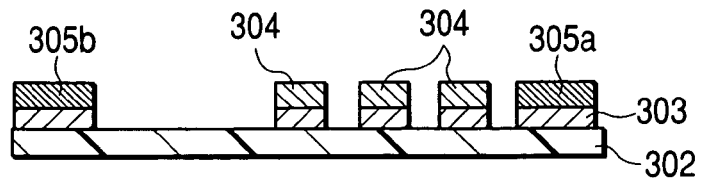

As shown FIG. 10D, a copper foil portion 306 exposed from the etching resist patterns 304; 305a and 305b is removed by etching as well known to form the vortex conductor pattern (102 in FIG. 8) serving as the antenna coil. In this etching process, FeCl$_2$ (120 g/l) is employed as the etchant at a temperature of 50° C. to remove the copper foil 303. Thereafter, generally, the electronic parts can not be packaged on the circuit, namely, on the vortex pattern composing the antenna coil, unless the etching resist formed in the process B is removed. However, in this invention, there are conductive resist patterns 305a and 305b as described in the process C, whereby there is no need for removing the etching resist by packaging the electronic parts on those patterns. That is, the process for peeling the etching resist is omitted in this invention, whereby there is the effect that the etching resist 304 formed by the insulating ink acts as an insulating protective layer on the copper foil circuit pattern.

Figure 10E:
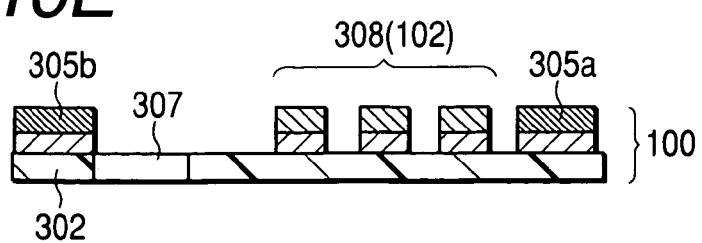

As shown in FIG. 10E, in this embodiment, a through hole 307, into which a convex portion (a potting portion 413 in FIG. 9) of the electronic component module is inserted, is press worked. In the above manner, the data carrier main body 100 is completed in which the vortex conductor pattern 308 (102) as the antenna coil is held on one side of the PET film base board 302 (101).

FIG. 11A-11G show one example of the manufacturing process for the electronic component module 200. Giving previous notice, the electronic component module 200 obtained through the manufacturing process has the almost same constitution as the electronic component module shown in FIG. 1F, except that the semiconductor chip 202 is resin sealed by the potting portion 413 (see FIG. 11G) and a conductive resist 412 is disposed in an electrode portion for connection with the data carrier main body 100.

Metal Foil Laminated Board Manufacturing Process

As shown in FIG. 11A, an Al-PET laminated board 401 as a base member of the film-like wiring board is manufactured. This Al-PET laminated board 401 is manufactured by laying a hard aluminum foil 403 having a thickness of 35 μm via a urethane adhesive on one side (upper face in the figure) of a PET film 402 having a thickness of 25 μm, and heat laminating and bonding them under the condition of 150° C. and a pressure of 5 kg/cm².

Etching Mask Printing Process

As shown in FIG. 11B, a first resist layer for forming an etching resist pattern having a required wiring pattern shape is formed on the surface of the hard aluminum foil 403 in the Al-PET laminated board 401. In this example, the first resist layer is formed as an epoxy thermosetting resin film 404 having SiO₂ particles (insulating particles) dispersed as indicated by "•" in the figure. More particularly, this epoxy thermosetting resin film (first resist layer) 404 is formed in a thickness of about 4 to 6 μm by coating an ink including epoxy resin 100 weight part and 30 weight part of SiO₂ particle shaving a particle diameter of 3 to 4 μm that are mixed into a solvent containing toluene 30%, methyl ethyl ketone 6.1% and butyl cellosolve 12% on the surface of the Al-PET laminated board 1 by gravure printing, and drying the ink at a temperature of 130 to 200° C. for 20 to 60 seconds. In this process, a thermosetting conductive adhesive for forming the etching resist pattern of required wiring pattern shape is coated on the surface 405a, 405b at the left and right ends of the hard aluminum foil 403, as shown in FIG. 11B. The details will be described below.

Etching Mask Printing Process

As shown in FIG. 11C, a thermoplastic resin film 406 as a second resist layer (serving as an adhesive layer) is formed on the entire surface of the thermosetting resin film 404 as the first resist layer. The formation of this thermoplastic resin film 406 is made by coating a polyorefine thermoplastic resin adhesive melted at a temperature of about 90 to 100° C., about 4 to 6 μm thick, on the surface of the thermosetting resin film 404 by gravure printing. That is, the surface of the thermosetting resin film 404 is totally covered with the thermoplastic resin film 406.

Etching Mask Printing Process

As shown in FIG. 11D, the conductive resist layers (conductive resist areas) 407a, 407b are formed on the surfaces 405a, 405b at both ends of the hard aluminum foil layer 403. This conductive resist layer 407 corresponds to a connection portion with the terminal pad portion 305a, 305b of the data carrier main body 100. The formation of the conductive resist area 407a, 407b is made by offset printing as in the previous process, and the ink may be the thermosetting conductive adhesive cured by heat treatment at 120° C. for about 20 minutes. The printing of the conductive ink in this process may be performed by screen printing typically employed, and the ink material may be a mixture of Ag particles and thermoplastic adhesives, containing a photo-polymerization agent, or a solder paste.

An etching resist pattern of required wiring pattern shape having the thermosetting resin film 404, the thermoplastic resin film 406, and the conductive resist areas 407a and 407b is formed on the hard aluminum foil 403 through the above processes as shown in FIGS. 11B to 11D.

Etching Process

As shown in FIG. 11E, an aluminum foil portion 409 exposed from the etching resist pattern 408 is removed by etching as well known to form a wiring pattern 410 including the hard aluminum foil 403. The formation of the wiring pattern 410 is made by dipping the aluminum foil portion 409 exposed from the etching resist pattern 408 in an etchant of NaOH (120 g/l) at a temperature of 50° C. Thereby, the wiring pattern 410 includes the hard aluminum foil 403 appears on the surface of a wiring board 411.

Ultrasonic Packaging Process

As shown in FIG. 11F, the semiconductor bear chip 202 is packaged on the wiring board 411 while applying ultrasonic wave. This process includes a step (first step) of pressing a bump 203 of the semiconductor bear chip 202 onto the thermoplastic resin film 406 in a melted state where the thermoplastic resin film 406 is heated and softened, while applying a ultrasonic wave, and forcing the bump 203 to shove away the melted thermoplastic resin film 406 and reach a surface of the thermosetting resin film 404, a step (second step) of pressing the bump 203 against the thermosetting resin film 404 by further applying ultrasonic wave to the bump 203 continually to separate the SiO₂ particles from the thermosetting resin film 404, and forcing the bump 10 to shove away the thermosetting resin film 404 and make contact with an electrode area 412 on the hard aluminum foil 403, and a step (third step) of ultrasonically bonding the bump 203 and the electrode area 412 by further applying ultrasonic wave continually in a state where the bump 203 and the electrode area 412 are contacted.

In this example, the semiconductor bear chip 202 is 150 μm thick, and constituted as a so-called surface packaging component in which the bump 203 as a metallic terminal for connection is jutted out from its bottom face. The bump 203 is plated with gold, and has a height of 14 μmm and a width of 80 μmm (80×80 μmm). In the first step, the bump 203 is pressed against the thermoplastic film 406 heated and melted at a temperature of 150° C. in a state where ultrasonic vibration is applied. Then, the melted thermoplastic resin film 406 is partially shoved away and removed from a top end position of the bump 203 owing to ultrasonic vibration of the bump 203, so that the bump 203 reaches the surface of the thermosetting resin film 404 having SiO₂ particles dispersed and included. In the second step, the bump 203 is pressed against the thermosetting resin film 404 in a state where ultrasonic vibration is further applied to the bump 203. Then, SiO₂ particles as indicated by "•" are swept up (separated) from within the thermosetting resin film 404 by the bump 203, so that holes as indicated by "O" are formed within the thermosetting resin film 404. The SiO₂ particles separated from the thermosetting resin film 404 maybe possibly absorbed (creep) into the melted thermoplastic resin film 406. Due to this occurrence of holes, the thermosetting resin film 404 is more fragile in durability, so that the bump 203 easily shoves (partially removes) the thermosetting resin film 404 to reach the surface (electrode area 412) of the aluminum foil wiring pattern 410. At this time, an oxide layer on the surface of the aluminum foil wiring pattern 410 is mechanically removed by ultrasonic vibration of the bump 203. Consequently, the bump 203 and the electrode area 412 are contacted. In the third process, the bump 203 and the electrode area 412 of the wiring pattern 410 are heated by a frictional heat generated by ultrasonic vibration of the bump, so that a metallic fusion portion having gold atoms diffused in the aluminum foil is formed to complete the ultrasonic bonding of both.

The first to third steps in the ultrasonic packaging process are completed by applying a ultrasonic vibration at a frequency of 63 KHz under a load pressure of 0.2 kg/mm² for about 1.5 seconds after the semiconductor bear chip 202 is disposed at a predetermined position.

Bonding Process

As shown in FIG. 11G, the melted thermoplastic resin film 406 is recured by natural cooling or forced cooling without heating the wiring board 411 to 150° C. to bond the main body of the semiconductor bear chip 202 and the wiring pattern 410. That is, the melted thermoplastic resin film 406 interposed between the bottom face of the semiconductor bear chip 202 and the wiring board 411 is cooled and solidified, so that the semiconductor bear chip 202 and the wiring board 411 are firmly bonded. Thereafter, the semiconductor bear chip 202 is resin sealed by a well-known method, as needed, to form the potting portion 413.

Figure 12A:
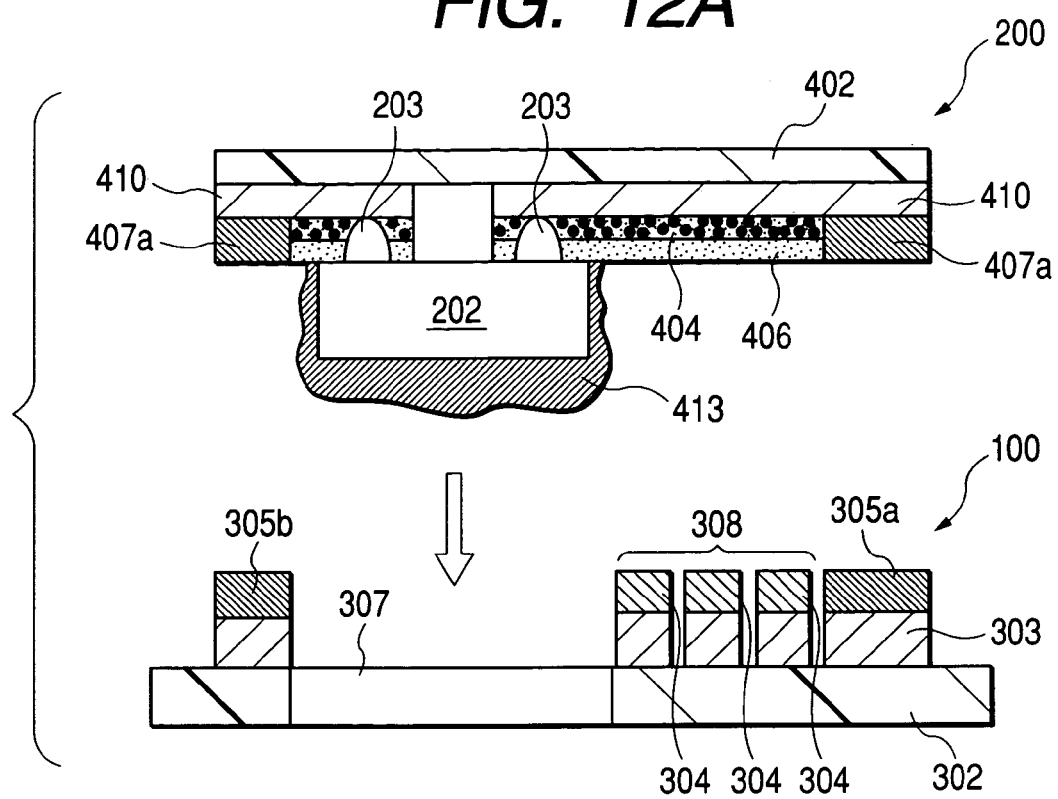
FIGS. 12A-12B are process views showing a packaging process of the electronic component module on the data carrier main body.
Figure 12B:
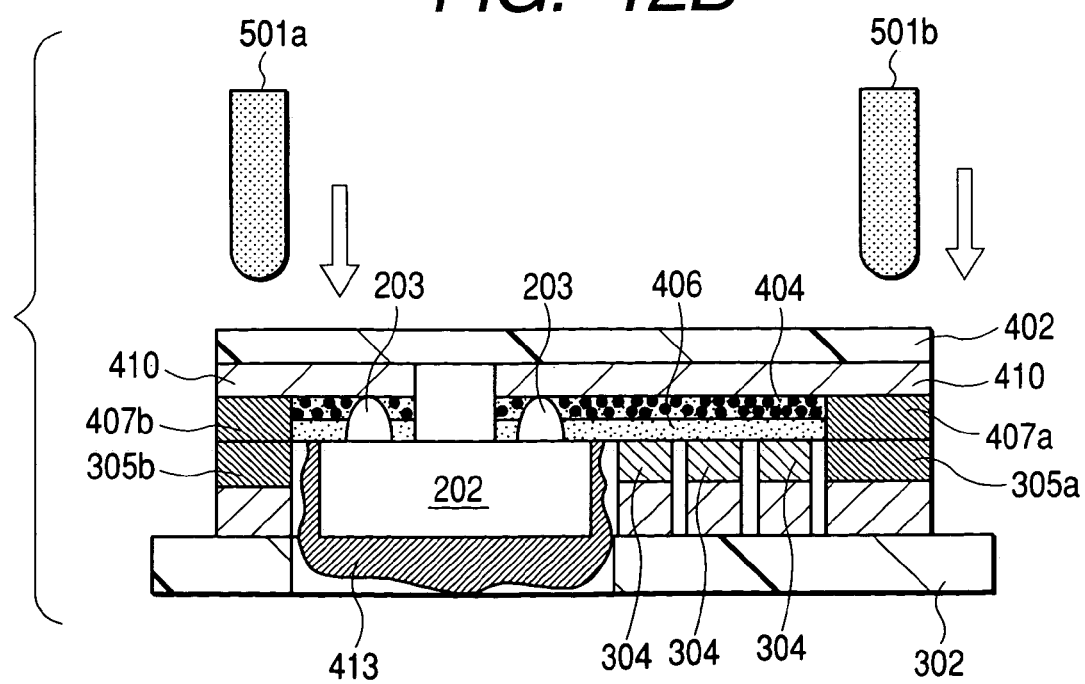

Referring to FIGS. 12A-12B, a procedure will be described below for mounting the electronic component module 200 on the data carrier main body 100 so that the insulating wafer 201 strides (or crosses) the surrounding conductor bundle 102a composing a vortex conductor pattern, and making its electrical connection with the vortex conductor pattern separately for each of the inner and outer circumferential sides in the vortex conductor pattern 102.

As shown in FIG. 12A, the electronic component module 200 is mounted on the data carrier main body 100 so that an electronic parts mounting face of the electronic component module 200 may be opposed to the conductor pattern formation face of the data carrier main body 100 and the electronic component module 200 strides (or crosses) the surrounding conductor bundle 102a composing the vortex conductor pattern 102. At this time, the potting portion 413 covering the bear chip 202 as an electronic component is received in a hole 307 opened on the side of the data carrier main body 100. Moreover, the conductive resist areas 407a, 407b serving as the electrode areas for a pair of aluminum foil areas 410, 410 conducting to the bumps 203, 203 of the semiconductor bear chip 202 on the side of the electronic component module 00 are located directly above a pair of conductive resist patterns 305a, 305b on the side of the data carrier main body 100. That is, the aluminum foil areas 410, 410 on the side of the electronic component module 200 and the conductive resist patterns 305a, 305b on the side of the data carrier main body 100 confront each other via the conductive resist areas 407a, 407b, respectively.

As shown in FIG. 12B, the indentators 501a, 501b heated at a temperature of 160° C. are pressed on the electronic component module 200, especially directly on a pair of conductive resist patterns 305a, 305b under a load pressure of 21.7 kg for 20 seconds. At this time, the conductive resist pattern of the thermoplastic adhesive film is locally softened and melted, so that the conductive resist areas 407a, 407b conducting to the terminal areas 410, 410 of the electronic component module 200 and the conductive resist patterns 305a, 305b on the data carrier main body 100 are bonded and secured. On the other hand, a portion of the thermoplastic resin film 406 is kept insulated and employed for bonding the electronic component module 200 and the data carrier main body 100. Moreover, since the etching resists 304 on the surface of the vortex conductor pattern 102 remain as the insulating material, the wiring pattern (not shown) on the insulating base wafer 402 (201) of the electronic component module 200 serves as a jumper member connecting the inner and outer circumferences of the vortex conductor pattern 102. Consequently, the electrical connection between the vortex conductor pattern 102 and the semiconductor bear chip 202 is enabled without the use of the jumper member and a back face wiring pattern as in the conventional structure.

Referring to FIGS. 13 to 16, a method for manufacturing a data carrier according to another embodiment of the invention will be described below. This data carrier is electromagnetically readable to operate as an aircraft tag, a physical distribution management label or an unmanned wicket pass. And this data carrier integrally comprises a data carrier main body holding a metallic pattern composing an antenna coil on a film-like resin base board, and an electronic component module having a semiconductor bear chip composing a transmitting and receiving circuit and a memory packaged in an aluminum foil wiring pattern on the surface of the film-like resin base board.

Figure 13:
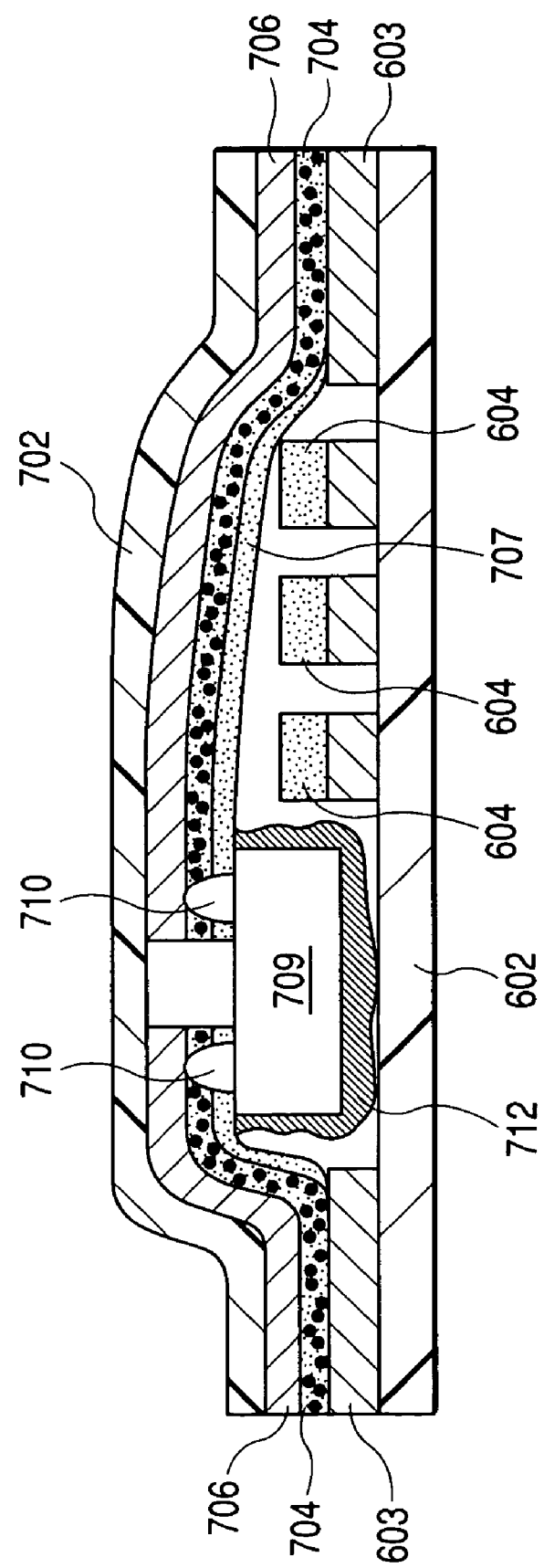
FIG. 13 is a cross-sectional view showing another example of the packaged structure of the electronic component module.

FIG. 13 is an enlarged cross-sectional view showing one example of a packaging structure of the electronic component module (corresponding to the cross-sectional view of FIG. 8 taken along the line 13-13). The method for manufacturing the data carrier main body and the electronic component module as shown in FIGS. 13 will be described below in succession.

FIG. 14 shows one example of a manufacturing process of the vortex conductor pattern 102 (FIG. 8) composing the antenna coil. Referring to FIG. 14, the process for forming the vortex conductor pattern 102 as the antenna coil on one side of the PET film base board 101 (FIG. 8) will be described below.

Figure 14A:
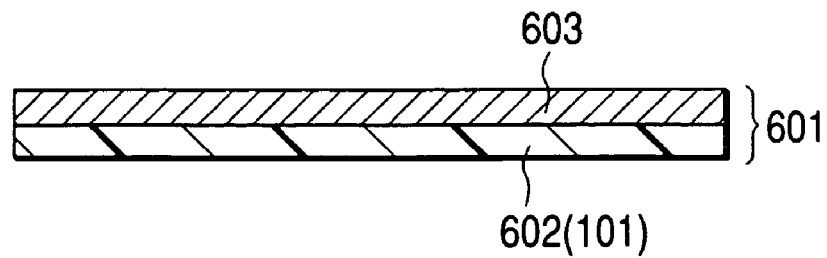
FIGS. 14A-14C are views showing another manufacturing process of the data carrier main body.

As shown in FIG. 14A, a Cu-PET laminate base board 601 is prepared. As one example, this Cu-PET laminate base board 601 is produced by laying a copper foil having a thickness of 10 μm via a urethane adhesive on one side of a PET film having a thickness of 25 μm, and heat laminating and bonding them under the condition of a temperature of 150° C. and a pressure of 5 kg/cm$^2$. Thereby, the Cu-PET laminated board 601 in which the copper foil 603 is attached on the surface of the PET film 602 (101) is completed.

Figure 14B:
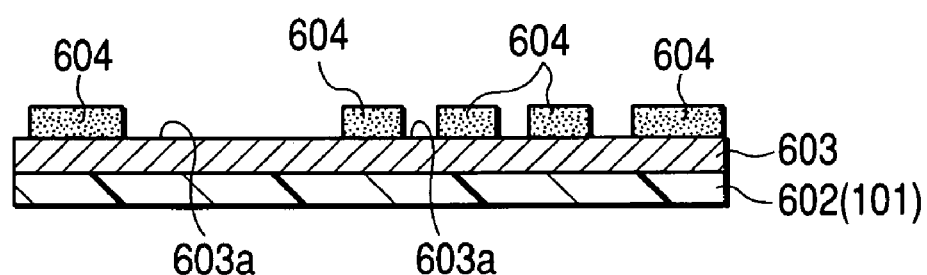

As shown in FIG. 14B, an etching resist pattern 604 of vortex shape and terminal shape is formed on the surface of the copper foil 603 in the Cu-PET laminated board 601. That is, an insulating etching resist ink is printed on the Cu foil of the vortex shape having the turn number providing the L value and the Q value, line width, pitch, and inner and outer circumferences required for the coil characteristics by offset printing. At this time, the resist ink may be cured by a heat ray or an active energy beam. The active energy beam is ultraviolet or electron beam, and when ultraviolet ray is employed, a photo-polymerization agent is mixed in the resist ink.

Figure 14C:
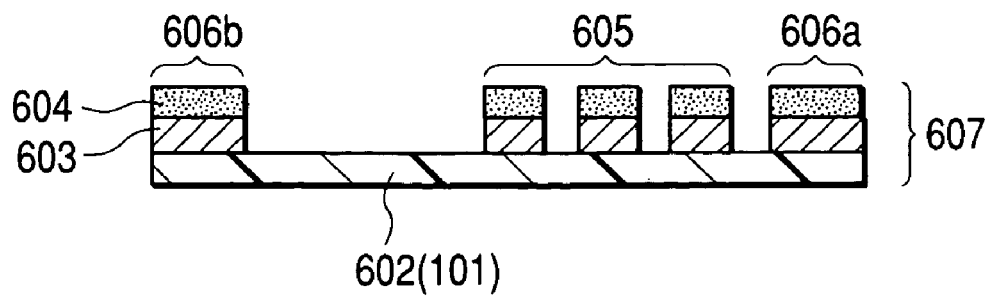

As shown in FIG. 14C, a Cu foil portion 603a exposed from the etching resist patterns 604 formed through the above processes is removed by etching as well known to form a vortex conductor pattern 605 serving as the antenna coil and the inner and outer circumferential terminal pads 606a and 606b. In this etching process, FeCl$_2$ (120 g/l) is employed as the etchant at a temperature of 50° C. to remove a copper foil portion as necessary.

Thereafter, generally, the electronic parts can not be packaged on the circuit, namely, on the coil, unless the etching resist 604 formed in the process as shown in FIG. 14B is removed. However, in this invention, since the etching resist located at the bonding scheduled portion 606a, 606b is removed by mechanical friction due to ultrasonic wave in bonding (see FIG. 13), there is no need for removing the insulating resist 604. That is, the process for peeling the etching resist is omitted in this invention, whereby there is the effect that the etching resist 604 acts as an insulating protective layer on the surface of the copper conductor pattern 605.

FIGS. 15A-15F show one example of the manufacturing process for the electronic component module 200. Giving previous notice, the manufacturing process for the electronic component module 200 as shown in FIGS. 15A-15F are substantially equivalent to that shown in FIG. 1A-1F, except that the semiconductor chip is resin sealed by potting. Accordingly, though the explanation is duplicated, the same portions are described again for caution's sake.

Metal Foil Laminated Board Manufacturing Process

As shown in FIG. 15A, an Al-PET laminated board 701 as a base member of the film-like wiring board is manufactured. This Al-PET laminated board 701 is manufactured by laying a hard aluminum foil 703 having a thickness of 35 µm via a urethane adhesive on one side (upper face in the figure) of a PET film 702 having a thickness of 25 µm, and heat laminating and bonding them under the condition of 150° C. and a pressure of 5 kg/cm$^2$.

Etching Mask Printing Process

As shown in FIG. 15B, an etching resist pattern having a required wiring pattern shape is formed on the surface of the hard aluminum foil 703 in the Al-PET laminated board 701. In this example, the resist pattern is formed as an epoxy thermosetting resin film 704 having SiO$_2$ particles (insulating particles) dispersed as indicated by "•" in FIG. 15B. More particularly, this epoxy thermosetting resin film (etching resist pattern) 704 is formed in a thickness of about 4 to 6 µm by coating an ink including epoxy resin 100 weight part and 30 weight part of SiO$_2$ particles having a particle diameter of 3 to 4 µm that are mixed into a solvent containing toluene 30%, methyl ethyl ketone 6.1% and butyl cellosolve 12% on the surface of the Al-PET laminated board 701 by gravure printing, and drying the ink at a temperature of 130 to 200° C. for 20 to 60 seconds.

Etching Process

As shown in FIG. 14C, an aluminum foil portion 705 exposed from the thermosetting resin film (etching resist pattern) 704 is removed by etching as well known to form a wiring pattern 706 including the hard aluminum foil 703. In this example, the formation of the wiring pattern 706 is made by dipping the aluminum foil portion 705 exposed from the thermosetting resin film 704 in an etchant of NaOH (120 g/l) at a temperature of 50° C. Thereby, the wiring pattern 706 including the hard aluminum foil 703 appears on the surface of a wiring board intermediate product 708a obtained in this etching process. And the surface of this wiring pattern 706 is totally covered with the epoxy thermosetting resin film 704 used as an etching resist pattern (etching mask). That is, the surface of at least the electrode area (a connection scheduled area with the bump of the semiconductor bear chip) in this wiring pattern 706 is covered with the thermosetting resin film 704. The coating thickness of the thermosetting resin film 704 is adjusted in accordance with the bump size and shape of the bear chip mounted.

Thermoplastic Resin Film Formation Process

As shown in FIG. 15D, a thermoplastic resin film 707 as an adhesive layer is formed on the entire surface of the thermosetting resin film 704 as an etching resist pattern. The formation of this thermoplastic resin film 707 is made by coating a polyorefine thermoplastic resin adhesive melted at temperature of about 90 to 100° C., about 4 to 6 µm thick, on the surface of the thermosetting resin film 704 by gravure printing. That is, the surface of the thermosetting resin film 704 is totally covered with the thermoplastic resin film 707. Thereby, a flip chip connecting wiring board (wiring board for packaging the semiconductor bear chip) 708 is completed. The coating thickness of the thermoplastic resin film 707 is adjusted in accordance with the bump size and shape of the bear chip mounted.

Ultrasonic Packaging Process

As shown in FIG. 15E, a semiconductor bear chip 709 is packaged on the wiring board 708 while applying ultrasonic wave. This process includes a step (first step) of pressing a bump 710 of the semiconductor bear chip 709 onto the thermoplastic resin film 707 in a melted state where the thermoplastic resin film 707 is heated and softened, while applying a ultrasonic wave, and forcing the bump 710 to shove away the melted thermoplastic resin film 707 and reach a surface of the thermosetting resin film 704, a step (second step) of pressing the bump 710 against the thermosetting resin film 704 by further applying ultrasonic wave to the bump 710 continually to separate the SiO$_2$ particles from the thermosetting resin film 704, and forcing the bump 710 to shove away the thermosetting resin film 704 and make contact with an electrode area 711, and a step (third step) of ultrasonically bonding the bump 710 and the electrode area 711 by further applying ultrasonic wave continually in a state where the bump 710 and the electrode area 711 are contacted.

In this example, the semiconductor bear chip 709 is 150 µm thick, and constituted as a so-called surface packaging component in which the bump 710 as a metallic terminal for connection is jutted out from its bottom face. The bump 710 is plated with gold, and has a height of 14 µm and a width of 80 µmm (80×80 µmm). In the first step, the bump 710 is pressed against the thermoplastic film 707 heated and melted at a temperature of 150° C. in a state where ultrasonic vibration is applied. Then, the melted thermoplastic resin film 707 is partially shoved away and removed from a top end position of the bump 710 owing to ultrasonic vibration of the bump 710, so that the bump 710 reaches the surface of the thermosetting resin film 704 having SiO$_2$ particles dispersed and included. In the second step, the bump 710 is pressed against the thermosetting resin film 704 in a state where ultrasonic vibration is further applied to the bump 710. Then, SiO$_2$ particles as indicated by "•" are swept up (separated) from within the thermosetting resin film 704 by the bump 710, so that holes as indicated by "O" are formed within the thermosetting resin film 704. The SiO$_2$ particles separated from the thermosetting resin film 704 maybe possibly absorbed (creep) into the melted thermoplastic resin film 707. Due to this occurrence of holes, thermosetting resin film 704 is more fragile in durability, so that the bump 710 easily shoves (partially removes) the thermosetting resin film 704 to reach the surface (electrode area 711) of the aluminum foil wiring pattern 706. At this time, an oxide layer on the surface of the aluminum foil wiring pattern 706 is mechanically removed by ultrasonic vibration of the bump 710. Consequently, the bump 710 and the electrode area 711 are contacted. In the third process, the bump 710 and the electrode area 711 of the wiring pattern 706 are heated by a frictional heat generated by ultrasonic vibration of the bump, so that a metallic fusion portion having gold atoms diffused in the aluminum foil is formed to complete the ultrasonic bonding of both.

The first to third steps in the ultrasonic packaging process are completed by applying a ultrasonic vibration at a frequency of 63 KHz under a load pressure of 0.2 kg/mm$^2$ for about 1.5 seconds after the semiconductor bear chip 202 is disposed at a predetermined position.

Bonding Process

As shown in FIG. 15F, the melted thermoplastic resin film 707 is recured by natural cooling or forced cooling without heating the wiring board 708 to 150° C. to bond the main body of the semiconductor bear chip 709 and the wiring pattern 706. That is, the melted thermoplastic resin film 707 filled between the bottom face of the semiconductor bear chip 709 and the wiring board 708 is cooled and solidified, so that the semiconductor bear chip 709 and the wiring board 708 are firmly bonded. Thereafter, the semiconductor bear chip 709 is resin sealed by a well-known method, as needed, to form a potting portion 712. In this manner, the electronic component module 700 is completed.

Figure 16A:
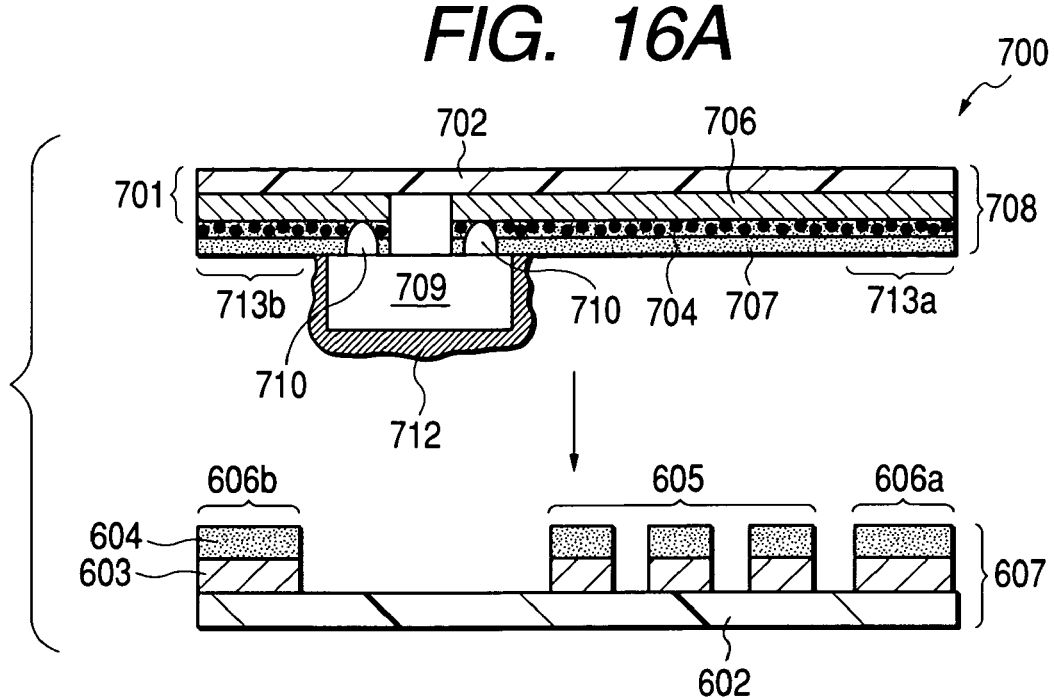
FIGS. 16A-16B are process views showing another packaging process of the electronic component module on the data carrier main body.
Figure 16B:
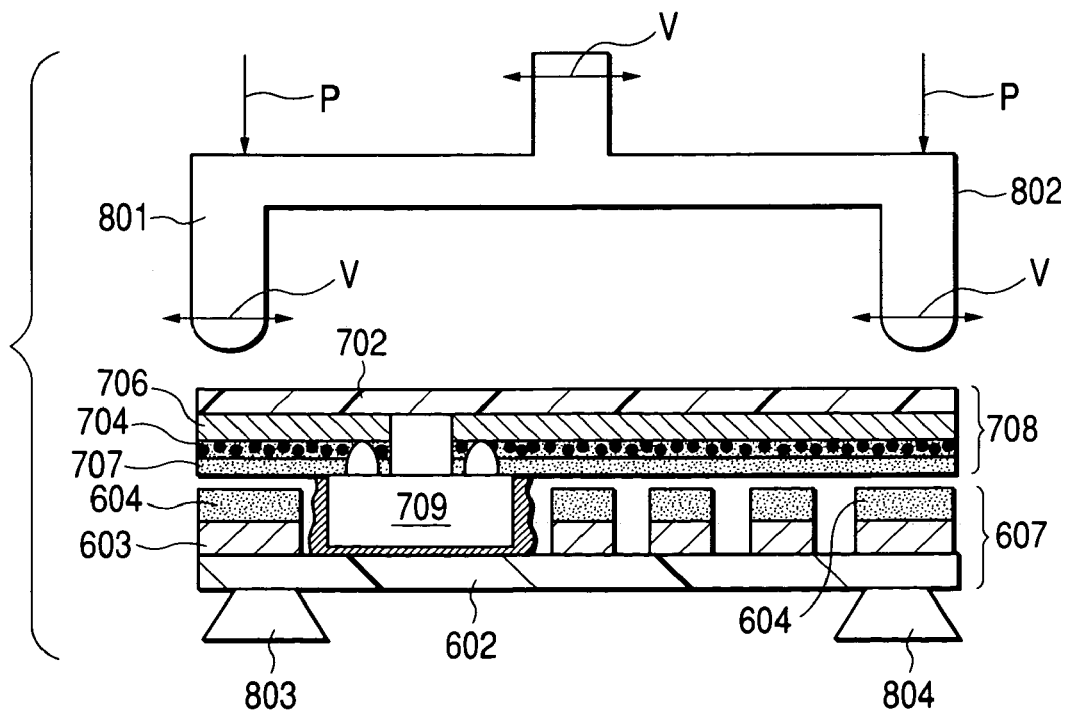
Figure 17:
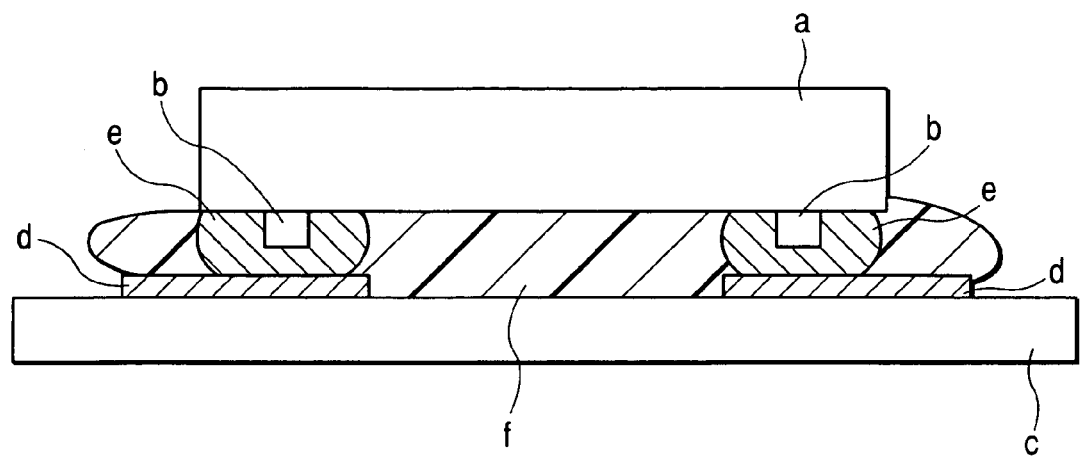
FIG. 17 is a view showing a first method for flip chip connection in the related art.
Figure 18:
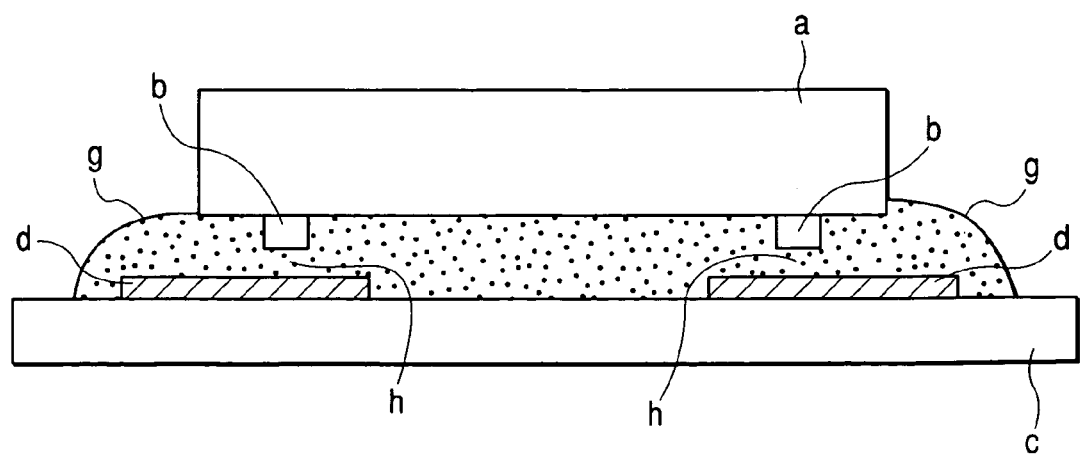
FIG. 18 is a view showing a second method for flip chip connection in the related art.
Figure 19A:
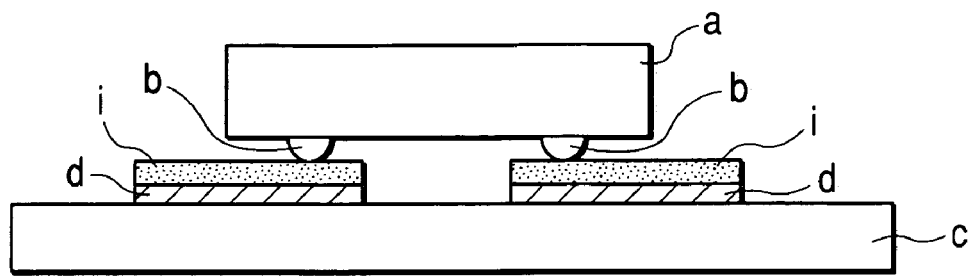
FIGS. 19A-19C are views showing a third method for flip chip connection in the related art.
Figure 19B:
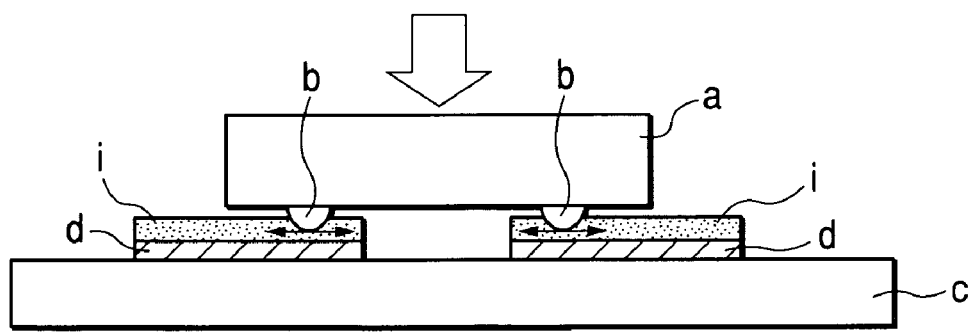
Figure 19C:
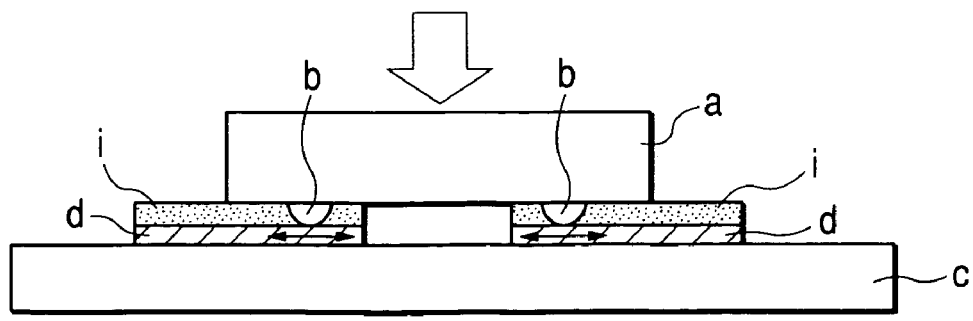

Referring to FIGS. 16A-16B, a process for packaging the electronic component module on the data carrier to make electrical connection with the antenna coil will be described below. This process is performed employing a ultrasonic welding technique.

As shown in FIG. 16A, the electronic component module 700 is mounted on the data carrier main body 607 so that the bonding scheduled portions 713a, 713b on the side of the electronic component module may be aligned with the terminal pads 606a, and 606b that are the bonding scheduled portions on the side of the data carrier main body.

As shown in FIG. 16B, a pair of indentators 801, 802 falling down integrally are pressed directly on the bonding scheduled portions 712a, 713b of the electronic component module 700 under a load pressure P (0.2 kg/mm$^2$) for the time T (0.5 seconds) while applying ultrasonic vibration at a frequency V (40 kHz). In FIG. 16, reference numerals 803, 804 denote the anvils opposed to the indentators 801, 802.

Generally, welding takes place when atoms approach each other to such a distance (several angstroms) to cause pulling forces to act between atoms on the metal faces to be joined, and the atoms on the entire faces are contacted in systematic arrangement. However, since the metal face is covered with a thin surface layer such as oxides and adsorption gas, clean metal atoms on the bed are prevented from being approached to a full bonding strength.

Thus, with this ultrasonic bonding method, the metal surface layers (including 713a, 713b, 606a and 606b in this example) are removed by ultrasonic vibration in the above way, and atoms are diffused by activating atomic vibration, so that the terminal of the electronic component module 700 and the terminal of the data carrier are securely bonded. That is, the thermosetting resin film 704 (at both end portions in FIG. 13) electrically connected with the bump 710 of the electronic component module 700 and the Cu foil portion 603 at the terminal portion (as indicated by numerals 103 and 104 in FIG. 8) of the data carrier are welded, as shown in Fog. 13.

This method is based on a principle of ultrasonic bonding in which the metal surface layer is removed by ultrasonic vibration. Even if the process as shown in FIG. 14B is performed without peeling the terminal pads 606a, 606b of the conductor pattern formed as the insulating etching resist, the full electrical and mechanical bonding characteristics between the electronic component module 700 and the data carrier main body 607 are obtained. Through the above processes, the film-like data carrier DC (see FIG. 8) according to this invention is completed.

In the above embodiment, a number of convex and concave portions corresponding to the shapes of the fusing portions are provided on the end faces of the anvils 803, 804 opposed to the identators 801, 802, while a plastic flow of metal is locally produced corresponding to the protruding portion by adjusting the pressing time of the identators 801, 802, so that the resin layers faced from a metal layer removal portion are fused by ultrasonic vibration. Especially when the metal fusion and the resin fusion are employed simultaneously, the mechanical bonding strength of the electronic component module is greatly increased, whereby this embodiment is effective when the data carrier is likely to be roughly handled such as an aircraft tag or a physical distribution management label.

The film-like data carrier completed in this manner employs the reading medium based on electromagnetic field, and reliably reads the data stored in the semiconductor from a distance of 100 to 1000 mm, without being subject to limitations on the reading distance or direction, especially on the directionality of reading.

Effect of the Invention

As will be apparent from the above description, with this invention, it is possible to provide the method for manufacturing the electronic component module in which the semiconductor bear chip is packaged on the wiring board rapidly in electrically and mechanically reliable way and at low cost, in which it is possible to prevent a short-circuit from occurring due to a contact between the semiconductor bear chip and the electrode area on the wiring board even in a situation where a high temperature and high pressure load is applied on the packaged portion of the semiconductor bear chip.

With the invention, it is possible to provide the method for manufacturing the electromagnetically readable data carrier at low cost and in mass production, in which the electromagnetically readable data carrier serves as an aircraft tag, a physical distribution management label, or an unmanned wicket pass.

What is claimed is:

1. A method for manufacturing an electronic component module having a semiconductor bear chip packaged on a wiring board, said method including:

preparing said wiring board including a wiring pattern, a thermosetting resin film covering an electrode area on said wiring pattern and having insulating particles dispersed and included, and a thermoplastic resin film covering said thermosetting resin film;

pressing a bump of the semiconductor bear chip onto the thermoplastic resin film in a melted state where said thermoplastic resin film is heated and softened, while applying an ultrasonic wave, so that the melted thermoplastic resin film is shoved away by said bump of the semiconductor bear chip and that said bump reaches a surface of said thermosetting resin film;

pressing said bump against said thermosetting resin film by continually applying said ultrasonic wave to said bump so that said insulating particles are separated from within the thermosetting resin film, the thermosetting resin film is shaved away by said bump, and said bump makes contact with said electrode area;

ultrasonically bonding said bump and said electrode area by continually applying said ultrasonic wave in a state where said bump and said electrode area are contacted; and bonding a semiconductor bear chip main body on said wiring board by cooling and solidifying said melted thermoplastic resin.

2. The method for manufacturing the electronic component module according to claim 1, wherein said insulating particles comprise at least one of silicone oxide and aluminum oxide.

3. The method for manufacturing the electronic component module according to claim 1, wherein said insulating particles comprise tetrafluoroethylene.

4. The method for manufacturing the electronic component module according to claim 1, wherein the content of insulating particles in the thermosetting resin film is 10 to 30% wt in the 100 wt % of resin.

5. The method for manufacturing the electronic component module according to claim 1, wherein the diameters of insulating particles are 70% or more of the thickness of the thermosetting resin film.

6. A method for manufacturing an electromagnetically readable data carrier including integrally a data carrier main body and an electric component module, said data carrier main body holding a conductor pattern composing an antenna on a film, said electric component module, in which a semiconductor bear chip having a transmitting/receiving circuit and a memory, being packaged on a wiring pattern of said film, sheet or thin plate-like wiring board, said method having manufacturing method for said electric component module comprising the steps of:

preparing said film, sheet or thin plate-like wiring board having said wiring pattern, a thermosetting resin film covering an electrode area on said wiring pattern and having insulating particles dispersed and included and a thermoplastic resin film covering said thermosetting resin film;

pressing a bump of the semiconductor bear chip onto the thermoplastic resin film in a melted state where said thermoplastic resin film is heated and softened, while applying a ultrasonic wave, so that the melted thermoplastic resin film is shoved away by said bump of the semiconductor bear chip and that said bump reaches a surface of said thermosetting resin film;

pressing said bump against said thermosetting resin film by continually applying ultrasonic wave to said bump so that said insulating particles are separated from within the thermosetting resin film, the thermosetting resin film is shaved away by said bump, and said bump makes contact with said electrode area;

ultrasonically bonding said bump and said electrode area by continually applying ultrasonic wave in a state where said bump and said electrode area are contacted; and bonding a semiconductor bear chip main body on said wiring board by cooling and solidifying said melted thermoplastic resin.

7. The method for manufacturing an electromagnetically readable data carrier according to claim 6, wherein said film-like resin substrate is used for a data carrier main body.

8. The method for manufacturing the electromagnetically readable data carrier according to claim 6, wherein said insulating particles comprise at least one of silicone oxide and aluminum oxide.

9. The method for manufacturing the electromagnetically readable data carrier according to claim 6, wherein said insulating particles comprise tetrafluoroethylene.

10. The method for manufacturing the electromagnetically readable data carrier according to claim 6, wherein the content of insulating particles in the thermosetting resin film is 10 to 30% wt in the 100 wt % of resin.

11. The method for manufacturing the electromagnetically readable data carrier according to claim 6, wherein the diameters of insulating particles are 70% or more of the thickness of the thermosetting resin film.

12. The method for manufacturing an electronic component module according to claim 1, wherein said insulating particles are uniformly dispersed within said thermosetting resin film.

* * * * *